(12) United States Patent
Oohata et al.

(10) Patent No.: US 7,087,934 B2
(45) Date of Patent: Aug. 8, 2006

(54) SEMICONDUCTOR LIGHT EMITTING DEVICE, IMAGE DISPLAY UNIT, LIGHTING APPARATUS, AND METHOD OF FABRICATING SEMICONDUCTOR LIGHT EMITTING DEVICE

(75) Inventors: Toyoharu Oohata, Kanagawa (JP); Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 10/192,232

(22) Filed: Jul. 10, 2002

(65) Prior Publication Data

US 2003/0087467 A1    May 8, 2003

(30) Foreign Application Priority Data

Nov. 7, 2001   (JP) .......................... P2001-211366

(51) Int. Cl.
  *H01L 29/22*   (2006.01)
  *H01L 33/00*   (2006.01)
  *H01L 21/00*   (2006.01)

(52) U.S. Cl. .................. 257/95; 257/E33.043
(58) Field of Classification Search ............ 257/95, 257/E33.043
  See application file for complete search history.

(56) References Cited

U.S. PATENT DOCUMENTS 5,434,434 A *  7/1995  Kasahara et al. ............ 257/84
5,923,045 A *  7/1999  Nihashi et al. ............... 257/10
6,734,030 B1 * 5/2004  Doi et al. ..................... 438/22

FOREIGN PATENT DOCUMENTS

| JP | 1-112502 | 7/1989 |
|----|----------|--------|
| JP | 9-051124 | 2/1997 |
| JP | 9-115667 | 5/1997 |
| JP | 10-012382 | 1/1998 |
| JP | 10-106327 | 4/1998 |

OTHER PUBLICATIONS

Applied Physics Letters, vol. 76, No. 22, May 29, 2000, Selective Growth of InGaN Quantum Dot Structures And Their Microphotoluminescence At Room Temperature, Tachibana et al., pp. 3212-3214.*

Journal of Crystal Growth, vol. 204, No. 3, Jul. 11, 1999, Singe-Crystal GaN Pyramids Grwon On (111) Si Substrates By Selective Lateral Overgrowth, Stringfellow et al., pp. 270-274.*

J. Wang et al., Fabrication Of Nanoscale Of InGaN by MOCVD Lateral Overgrowth, Journal of Crystal Growth 197 (1999), pp. 48-53.*

A.J. Glass and A. H. Guenther, "Laser induced damage in optical materials: 7th ASTM symposium", Applied Optics, vol. 15, No. 6, Jun. 1976, pp. 1510-1529.*

* cited by examiner

*Primary Examiner*—W. David Coleman
(74) *Attorney, Agent, or Firm*—Bell, Boyd & Lloyd LLC

(57) ABSTRACT

A semiconductor light emitting device includes a crystal growth layer, and a crystal layer composed of a first conductive type layer, an active layer, and a second conductive type layer. The crystal layer is provided on the upper side of the crystal growth layer. In this device, a back plane of the crystal growth layer has irregularities. Since light generated in the device is prevented from being totally reflected from the back plane of the crystal growth layer, the light emergence efficiency of the device can be increased.

19 Claims, 21 Drawing Sheets

EXCIMER
LASER BEAM

EXCIMER LASER BEAM

EXCIMER LASER BEAM

US 7,087,934 B2

SEMICONDUCTOR LIGHT EMITTING DEVICE, IMAGE DISPLAY UNIT, LIGHTING APPARATUS, AND METHOD OF FABRICATING SEMICONDUCTOR LIGHT EMITTING DEVICE

BACKGROUND OF THE INVENTION

The present invention relates to a semiconductor light emitting device having a double-hetero structure in which a first conductive type layer, an active layer, and a second conductive type layer are stacked, an image display unit and a lighting apparatus using the semiconductor light emitting device and a method of fabricating the semiconductor light emitting device. In particular, the present invention relates to a semiconductor light emitting device capable of enhancing the light emergence efficiency and a method of fabricating the semiconductor light emitting device.

Various methods have been proposed to enhance luminous of a semiconductor light emitting device. Such methods are mainly classified into a technique of increasing a quantity of light emission generated in a device to an input current of the device, and a technique of increasing a light emergence efficiency; that is, a characteristic to allow light generated in a device to efficiently emerge outwardly from the device. The former technique is greatly dependent on materials forming crystal layers, a crystal structure, a crystal growth characteristic, a combination of the crystal layers, and a fabrication process. The latter technique is intended to allow light generated in a device to emerge outwardly from the device without attenuation of the light; that is, without leakage of the light in consideration of a device structure and reflectance of light due to the device structure at the time when the device is mounted to an apparatus board.

In particular, the latter technique has a difficulty in that if light generated in a light emission region of a semiconductor light emitting device enters a light emergence plane at a large incident angle, such light is not allowed to emerge outwardly from the device due to total reflection. To cope with such an inconvenience, there has been proposed a method of allowing light totally reflected from a boundary plane of a device housed in a package to be reflected again from an inner mirror provided in the package and hence to emerge outwardly from the device, and a method of allowing light generated in a semiconductor light emitting device to be directly reflected from an inner mirror with its angle adjusted provided in a package and hence to emerge outwardly from the device. Also, there is known a method of suppressing a reduction in light emergence efficiency due to total reflection for a semiconductor light emitting device having a structure called a "planar type structure" in which crystal layers are grown on a plane parallel to a crystal growth substrate. According to this method, light generated from the crystal layer forming a light emission region in random directions is adjusted in one direction by an external mirror housed in a package.

Other methods of increasing a light emergence efficiency have been proposed. For example, a light emitting device having a semiconductor light emitting device main body including a light emission region and a device mounting portion including a light reflecting portion, which is provided separately from the device, has been known from Japanese Patent Laid-open No. Hei 9-51124.

On the other hand, in recent years, semiconductor light emitting devices for adjusting an angle of light, not by a reflecting mirror or the like housed in a package, but by an electrode provided in the device have been proposed. For example, a semiconductor light emitting device having a pyramid shape using a gallium nitride based compound semiconductor as a material for a crystal layer has been known. In this device, a quantity of light emission generated in the device to an input current of the device can be increased and the light emergence efficiency can be increased irrespective of the package structure.

By the way, for a semiconductor light emitting device by growing crystal on a flat principal plane of a substrate having a specific crystal plane by epitaxial growth, a boundary plane between the substrate and the crystal layer is flatted. In this case, if the back plane of a crystal layer, at which the substrate is joined to the device, is taken as a light emergence plane, part of light generated in the device is not allowed to emerge outwardly from the device due to total reflection, thereby failing to increase the light emergence efficiency.

In the case of fabricating a planar image display unit requiring a light control board for adjusting the optical path in one direction or the like, in addition to each device main body including a light emission region, it is difficult to display an image with a high resolution by arraying fine devices and controlling light emission for each of the devices.

Accordingly, it has been required to develop a high performance image display unit and a high performance lighting apparatus, each of which is capable of reducing the quantity of part of the light generated from a light emission region in random directions, which part is not allowed to emerge outwardly from the device due to total reflection from a light emergence plane, to increase the light emergence efficiency, thereby preparing devices with high luminescence without changing the sizes of the devices, and miniaturizing the sizes of the devices and arraying the miniaturized devices.

In particular, for a pyramid-shaped semiconductor light emitting device, the light emergence efficiency has been improved by allowing light generated from a light emission region of the device in random directions to be subjected to multi-reflection from an electrode formed on a tilt plane. However, the tilt plane on which the electrode is formed is set to a specific angle to a light emergence plane, so that there remains part of the light entering the light emergence plane at an angle allowing total reflection. As a result, it fails to further increase the light emergence efficiency and to sufficiently achieve the performance of the device.

SUMMARY OF THE INVENTION

An object of the present invention is to provide a semiconductor light emitting device capable of enhancing a light emergence efficiency of the device without increasing the number of fabrication steps, and also miniaturizing the device, and to provide a method of fabricating such a semiconductor light emitting device.

Another object of the present invention is to provide a high performance image display unit and a high performance lighting apparatus, each of which is fabricated by arraying a number of the above semiconductor light emitting devices.

To achieve the above objects, according to one embodiment of the present invention, there is provided a semiconductor light emitting device including a crystal growth layer, and a crystal layer composed of a first conductive type layer, an active layer, and a second conductive type layer. The crystal layer is provided on the upper side of the crystal growth layer. The light emitting device is characterized in that a back plane of the crystal growth layer has irregularities.

With this configuration, it is possible to suppress light generated in the device from being totally reflected from the irregularities on the back plane of the crystal growth layer, and to improve the light emergence efficiency by allowing the light to be scattered from the irregularities on the back plane of the crystal growth layer.

The irregularities can be formed on the back plane of the crystal growth layer by irradiating the back plane with an energy beam. In this case, by focusing the energy beam, it is possible to form the irregularities fine enough to suppress total reflection. The irregularities also can be formed on the back plane of the crystal growth layer by growing the crystal growth layer on a substrate having irregularities and peeling the semiconductor light emitting device from the substrate.

As one example of the semiconductor light emitting device of the present invention, a crystal growth layer can be formed using a nitride semiconductor having a wurtzite type crystal structure. In particular, a tilted crystal growth layer formed by selective growth from an opening portion formed in a mask or from an under growth layer disposed on a substrate in such a manner as to be tilted from the principal plane of the substrate has good crystallinity, thereby allowing a large quantity of light emission. In the case of forming the irregularities on the back plane of the tilted crystal growth layer, the light emergence efficiency can be further increased. As a result, a light emitting device including such a tilted crystal growth layer can sufficiently achieve the performance.

The fabrication method of the present invention can be effectively applied not only to the semiconductor light emitting device having the above-described shape but also to a semiconductor light emitting device having a structure failing to increase the light emergence efficiency due to total reflection caused by a flat plane of a crystal layer. The present invention can further provide an image display unit and a lighting apparatus, wherein the above-described semiconductor light emitting devices are arrayed, each of which emits light in response to a signal.

Additional features and advantages of the present invention are described in, and will be apparent from, the following Detailed Description of the Invention and the Figures.

DETAILED DESCRIPTION OF THE INVENTION

Figure 1:
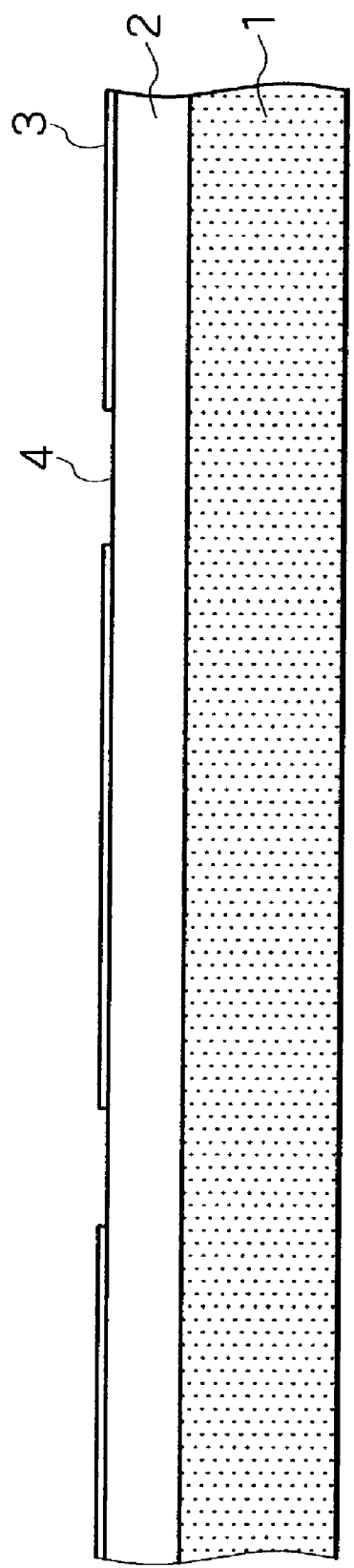
FIG. 1 is a sectional view showing a step of forming a mask in a method of fabricating a semiconductor light emitting device according to a first embodiment of the present invention.

The present invention relates to a semiconductor light emitting device, an image display unit, a lighting apparatus, and a method of fabricating a semiconductor light emitting device. More specifically, the present invention relates to a semiconductor light emitting device capable of increasing a light emergence efficiency by forming irregularities on a back plane, opposed to a plane on which a crystal layer is grown, of an under crystal growth layer of the semiconductor light emitting device and a method of fabricating the semiconductor light emitting device.

A semiconductor light emitting device of the present invention is configured such that a crystal layer composed of a first conductive type layer, an active layer, and a second conductive type layer is provided on an upper side of a crystal growth layer, wherein a back plane of the crystal growth layer has irregularities. The crystal growth layer may be formed by crystal growth in the direction parallel to a principal plane of a substrate or formed by crystal growth in the direction tilted from the principal plane of the substrate. In the following embodiments, description will be made by example of a semiconductor light emitting device having a crystal growth layer tilted from a principal plane of a substrate.

Various kinds of substrates can be used for the present invention. In particular, a substrate made from sapphire ($Al_2O_3$, having A-plane, R-plane, or C-plane), SiC (having a structure of 6H, 4H or 3C), GaN, Si, ZnS, ZnO, AlN, LiMgO, GaAs, $MgAl_2O_4$, or InAlGaN is preferable in terms of formation of a crystal growth layer having a crystal plane tilted from the principal plane of the substrate. Such a material for forming a substrate preferably has a hexagonal or cubic system; most preferably, the hexagonal system. For example, in the case of using a sapphire substrate, the C-plane of sapphire may be taken as a principal plane of the sapphire substrate. Such a sapphire substrate often has been used for growing a gallium nitride (GaN) based compound semiconductor. It is to be noted that the C-plane of sapphire taken as the principal plane of the sapphire substrate may include a plane tilted from the strict C-plane by an angle ranging from 5° to 6°. The substrate does not form part of a light emitting device as a product. To be more specific, the substrate is used for holding a device portion during fabrication, and is removed before accomplishment of the light emitting device.

The crystal growth layer having a crystal plane tilted from the principal plane of a substrate may be made from a material which allows formation of a light emission layer including a first conductive type layer, an active layer, and a second conductive type layer on the crystal growth layer made from the material. In particular, it is desirable for the crystal growth layer to have a wurtzite type crystal structure. Specifically, the crystal growth layer may be made from a group III based compound semiconductor, a BeMgZnCdS based semiconductor, or a BeMgZnCdO based compound semiconductor. More specifically, the crystal growth layer may be made from an indium nitride (InN) based compound semiconductor, an indium gallium nitride (InGaN) based compound semiconductor, or aluminum gallium nitride (AlGaN) based compound semiconductor. In particular, a gallium nitride based compound semiconductor is preferably used. The tilt crystal plane of the crystal growth layer may be selected from an S-plane, a (11–22) plane, and planes tilted therefrom by an angle ranging from 5° to 6°.

Before a crystal growth layer is formed, an under growth layer is preferably formed on a substrate. The under growth layer may be made from gallium nitride or aluminum nitride. The under growth layer may be combined with a low temperature buffer layer or a high temperature buffer layer, or combined with a crystal seed layer functioning as a buffer layer and a crystal seed.

In the case of carrying out crystal growth using a selective growth method, if any crystal seed layer is not provided, crystal growth must be originated from a buffer layer. However, when selective growth is originated from the buffer layer, crystal growth is liable to occur even at a location where crystal growth is not desired or blocked. For this reason, to achieve selective crystal growth in a desired region, a crystal seed layer may be provided.

According to the present invention, a crystal growth layer has a crystal plane tilted from the principal plane of a substrate. In particular, the crystal growth layer may be formed into an approximately hexagonal pyramid shape in which the S-planes or planes substantially equivalent to the S-planes form tilt planes of the approximately hexagonal pyramid shape. The crystal growth layer also may be formed into an approximately truncated hexagonal pyramid shape in which the S-planes or planes substantially equivalent to the S-planes form tilt planes of the approximately truncated hexagonal pyramid shape and the C-plane or a plane substantially equivalent to the C-plane forms an upper flat plane of the approximately truncated hexagonal pyramid shape. The approximately hexagonal pyramid shape or the approximately truncated hexagonal pyramid shape is not required to accurately correspond to a hexagonal pyramid shape, and may be an imperfect hexagonal pyramid shape with some of the planes thereof lost. As a preferable example, six crystal planes tilted from the principal plane of a substrate are disposed in such a manner as to be substantially symmetric to each other. The substantially symmetric shape includes not only a perfect symmetric shape but also an imperfect symmetric shape somewhat deviated from the perfect symmetric shape. A ridge between crystal planes of a crystal growth layer is not necessarily linear. Also, an approximately hexagonal pyramid shape or an approximately truncated hexagonal pyramid shape may extend linearly.

The selective growth is concretely performed by selectively removing part of an under growth layer, or by making use of an opening formed in a mask layer formed on the under growth layer or formed before formation of the under growth layer. For example, if the under growth layer is composed of a buffer layer and a crystal, seed layer, the crystal seed layer on the buffer layer may be divided into dotted fine regions each having a diameter of about 10 μm, and a crystal growth layer having the S-planes or the like may be formed by crystal growth from the fine crystal seed regions. For example, the finely divided crystal seed regions may be arrayed in such a manner as to be spaced from each other in consideration of each margin for separating light emitting devices from each other. Further, each of the finely divided crystal seed regions may be formed into a circular shape, a square shape, a hexagonal shape, a triangular shape, a rectangular shape, a rhombic shape, or a similar shape thereto. Selective growth may be performed by forming a mask layer on an under growth layer and selectively forming an opening portion; that is, a window region in the mask layer. The mask layer may be formed silicon oxide or silicon nitride. For an approximately hexagonal pyramid shape or an approximately truncated hexagonal pyramid shape linearly extending as described above, that is, for a pyramid shape or a truncated pyramid shape longer in one direction, a window region formed in a mask layer may be formed into a strip shape.

In the case of carrying out selective growth by using a selective growth mask, if growth proceeds only on an opening portion or a window region formed in the selective growth mask, lateral growth does not occur. In this case, micro-channel expitaxy may be used to cause lateral growth such that the crystal growth layer is enlarged from the window region. The lateral growth using such micro-channel epitaxy is effective to avoid through-dislocations, thereby reducing the density of the dislocations. The lateral growth is further effective to enlarge a light emission region, equalize a current, avoid concentration of current, and reduce the current density.

According to the semiconductor light emitting device of the present invention, a first conductive type layer, an active layer, and a second conductive type layer are formed on a crystal growth layer in such a manner as to extend in a plane parallel to a crystal plane tilted from the principal plane of a substrate. The first conductive type layer is a p-type or an n-type cladding layer, and the second conductive type layer is an n-type or a p-type cladding layer. If the crystal growth layer having the S-planes is formed by a silicon-doped gallium nitride based compound semiconductor layer, the n-type cladding layer may be formed by a silicon-doped gallium nitride based compound semiconductor layer, an InGaN layer may be formed as the active layer thereon, and the p-type cladding layer may be formed by a magnesium-doped gallium nitride compound semiconductor layer thereon, to form a semiconductor crystal layer having a double-hetero structure. The active layer may have a structure in which an InGaN layer is held between AlGaN layers. The active layer may be a single bulk active layer; however, it may have a quantum well structure such as a single quantum well (SQW) structure, a double quantum well (DQW) structure, or a multi-quantum well (MQW) structure. In the case of adopting the quantum well structure, a barrier layer is used for separating quantum wells from each other. The use of the InGaN layer as the active layer is advantageous in facilitating the fabricating process and enhancing a light emission characteristic of the device. Another advantage of the use of the InGaN layer is that the InGaN layer can be particularly and easily crystallized with good crystallinity on the S-plane from which nitrogen atoms are less adsorbed, with a result that the luminous efficiency can be enhanced.

Even in a state that a nitride semiconductor is not doped with an impurity, the conductive type of the nitride semiconductor becomes the n-type because of vacancies of nitrogen formed in crystal; however, the nitride semiconductor may be doped with a doner impurity such as Si, Ge, or Se during crystal growth to obtain an n-type nitride semiconductor having a desirable carrier concentration. On the other hand, a p-type nitride semiconductor is obtained by doping an acceptor impurity such as Mg, Zn, C, Be, Ca, or Ba in crystal. In this case, to obtain a p-type nitride semiconductor having a high carrier concentration, the nitride semiconductor having been doped with an acceptor impurity may be annealed in an inert gas atmosphere such as nitrogen or argon at a temperature or 400° C. or more, or activated by irradiation of electron beams, microwaves, or light.

These first conductive type layer, active layer, and second conductive type layer are formed on a crystal growth layer in such a manner as to extend within a plane parallel to a crystal plane tilted from the principal plane of a substrate. The formation of these layers easily can be performed by continuing, after formation of the crystal growth layer, crystal growth on the tilt crystal plane. If the crystal growth layer has an approximately hexagonal pyramid shape or an approximately truncated hexagonal pyramid shape having the S-planes as tilt crystal planes, the light emission crystal layer including the first conductive type layer, active layer, and second conductive type layer can be wholly or partially formed on the S-planes. For an approximately truncated hexagonal pyramid shape, the first conductive type layer, active layer, and second conductive type layer can be formed on an upper plane parallel to the principal plane of the substrate. The light emission using the tilt plane is advantageous in that light is attenuated by multi-reflection for a flat plate; however, light is not subjected to multi-reflection for the tilt plane, to emerge outwardly from a semiconductor. The first conductive type layer, that is, cladding layer, can have the same conductive type as that of the crystal growth layer having the S-planes by using the same material as that of the crystal growth layer. For example, after the formation of the crystal growth layer, the first conductive type layer can be formed by using the same material while continuously adjusting the concentration. Further, part of the crystal growth layer having the S-planes can function as the first conductive type layer. In addition, by tilting a light emergence plane in the direction perpendicular to the substrate, the light emergence efficiency can be improved.

According to the above-described semiconductor light emitting device, the luminous efficiency can be enhanced by making use of good crystallinity of the crystal plane tilted from the principal plane of a substrate. In particular, since the S-plane is excellent in incorporation of In and crystallinity, the luminous efficiency can be enhanced by injecting a current only to the S-plane. The area of the active layer extending within a plane substantially parallel to the S-plane becomes larger than the area, projected on the principal plane of a substrate or an under growth layer, of the active layer. As a result, the luminous area of the device becomes larger, to thereby reduce the current density. The increased area of the active layer is also effective to reduce the saturated luminance and, hence, to increase the luminous efficiency.

In relation to a hexagonal pyramid shaped crystal growth layer, at a portion, near the vertex, of the S-plane, the state of crystal growth step is degraded and the luminous efficiency is reduced. It is now assumed that each plane of a hexagonal pyramid shape is divided into a vertex side, a left side, a right side, and a bottom side with respect to an approximately central portion, the crystal growth step of the vertex side portion is most wavy, so that abnormal growth is liable to occur at the vertex side portion. On the left and right sides of the plane, the crystal growth step becomes linear and is dense. Such crystal growth step is significantly desirable. On the bottom side, the crystal growth step is slightly wavy; however, abnormal growth does not occur so much as compared with the abnormal growth on the vertex side. As a result, according to the above-described semiconductor light emitting device, the current injection to the active layer at a portion near the vertex may be performed at a density lower than that for a portion apart from the vertex. To achieve the current injection at a portion near the vertex at a low density, an electrode may be formed not at the vertex portion but at a tilted side portion, or a current block region may be formed before formation of an electrode at the vertex portion.

Electrodes are formed on both a crystal growth layer and a second conductive type layer. To reduce a contact resistance, a contact layer may be formed, and an electrode be formed on the contact layer. In the case of forming these electrodes on the same side on which the crystal growth layer is formed, if both a p-electrode and an n-electrode come in contact with the crystal growth layer and a crystal seed layer formed under a mask, there occurs a short-circuit. Therefore, the electrodes must be accurately formed by vapor-deposition.

An image display unit or a lighting apparatus can be fabricated by arraying a number of the above-described semiconductor light emitting devices, wherein sets of the light emitting devices, each having three devices for emission of three colors, are arrayed in such a manner as to allow scanning therefor. For such an image display unit or a lighting apparatus, since the electrode area can be reduced by making use of the S-plane, it is possible to reduce the area of a display screen.

[First Embodiment]

A first embodiment of the present invention will be described with reference to FIGS. 1 to 11.

First, steps of forming a first conductive type layer, an active layer and a second conductive type layer, and forming an electrode on the second conductive type layer, to form a basic structure of each of semiconductor light emitting devices according to the present invention, and the basic structure of the semi-finished light emitting device thus formed will be described with reference to FIGS. 1 to 4.

A low temperature buffer layer is formed on a principal plane, taken as a (C+)-plane of sapphire, of a sapphire substrate 1. The sapphire substrate 1 is heated to 1000° C., and a silicon-doped GaN layer 2 is formed on the low temperature buffer layer. A mask layer 3 made from $SiO_2$ or SiN is formed to a thickness ranging from 100 nm to 500 nm over the entire surface of the GaN layer 2, and as shown in FIG. 1, window regions 4 composed of circular opening portions each having a size of about 10 μm are formed in the mask layer 3 by photolithography and etching using hydrofluoric acid as an etchant. It is to be noted that the size of the opening portion may be changed depending on characteristics of a device to be fabricated.

Figure 2:
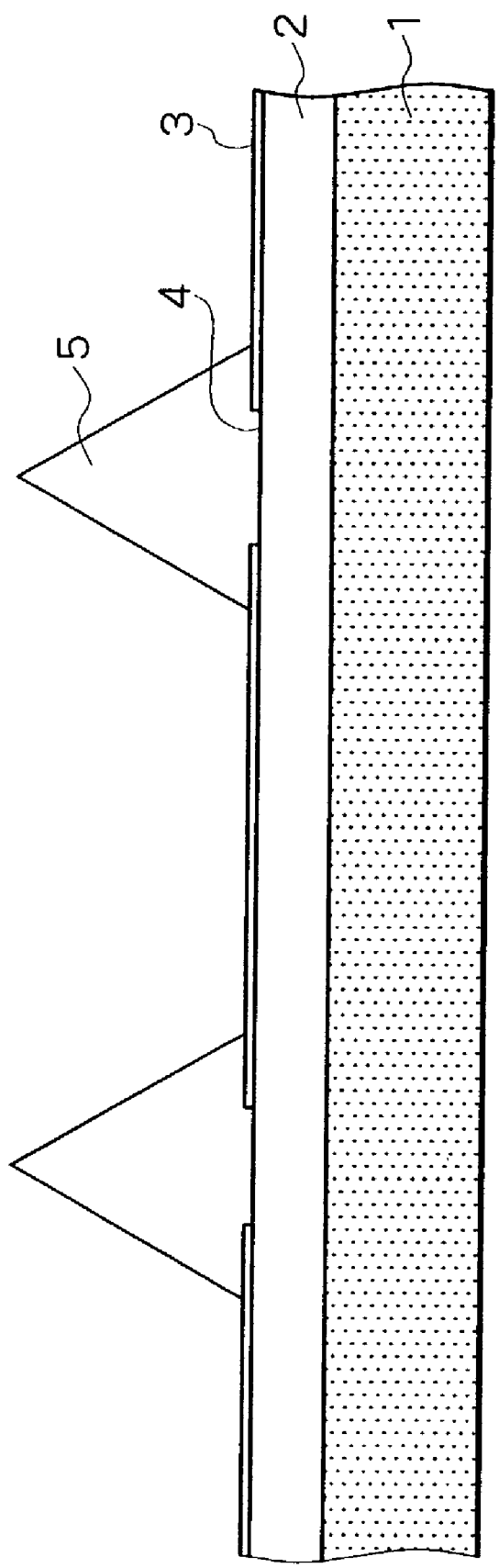
FIG. 2 is a sectional view showing a step of forming a crystal layer in the method of fabricating a semiconductor light emitting device according to the first embodiment of the present invention.

The sapphire substrate 1 is heated again up to a growth temperature of 1000° C., and as shown in FIG. 2, a silicon-doped GaN layer 5 is formed by crystal growth. At the beginning of crystal growth, the silicon-doped GaN layer 5 is grown from each of the circular window regions 4, and is then grown into a hexagonal pyramid shape having S-planes; that is, (1–101)-planes as outer planes. If the growth time is insufficient, the growth shape of the GaN layer 5 becomes a truncated hexagonal pyramid shape. In this embodiment, the GaN layer 5 is sufficiently grown to a hexagonal pyramid shape having a width of about 20 μm (the length of one side: about 10 μm). In this case, the height of the hexagonal pyramid shape becomes about 1.6 times the length of one side. As shown in FIG. 2, the silicon-doped GaN layer 5 thus formed has a bottom plane having the size of about 16 μm spread outwardly from the window region 4. It is to be noted that, although the size of the hexagonal pyramid shape is set such that the width thereof becomes about 20 μm in this embodiment, it is for illustrative purpose only and, for example, the size of the hexagonal pyramid shape may be set such that the width thereof becomes about 10 μm.

Figure 3:
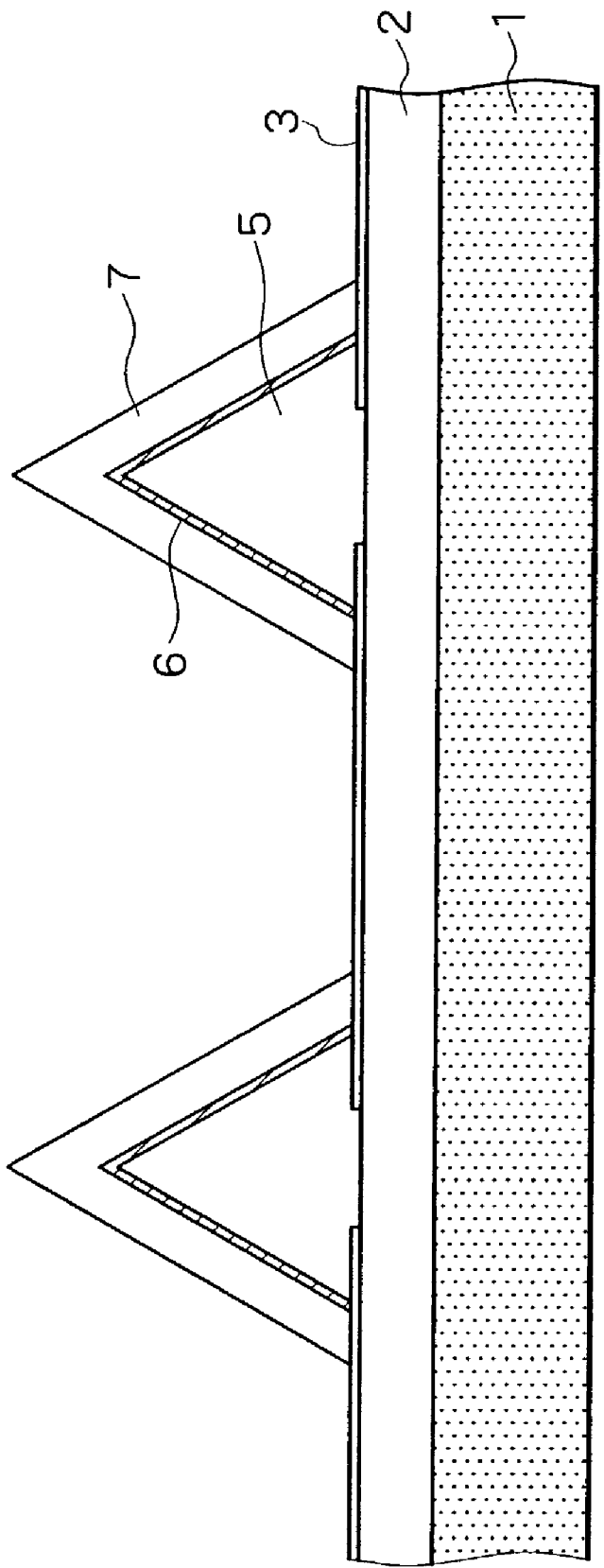
FIG. 3 is a sectional view showing a step of forming an active layer in the method of fabricating a semiconductor light emitting device according to the first embodiment of the present invention.

After the silicon-doped GaN layer 5 is grown, the crystal growth temperature is lowered and, as shown in FIG. 3, an InGaN layer 6 is grown as an active layer. After that, as shown in FIG. 3, the crystal growth temperature is raised again, and a magnesium-doped GaN layer 7 is grown as a p-type cladding layer. The thickness of the InGaN layer 6 as the active layer is set to about 0.5 nm to 3 nm. The active layer may be configured as a quantum well layer such as an (Al)GaN/InGaN layer or may be a multi-quantum well layer. The multi-quantum well structure may be formed, for example, using GaN or InGaN functioning as a guide layer. In this case, it may be desirable to form an AlGaN layer as an immediately upper layer of an InGaN layer.

Figure 4:
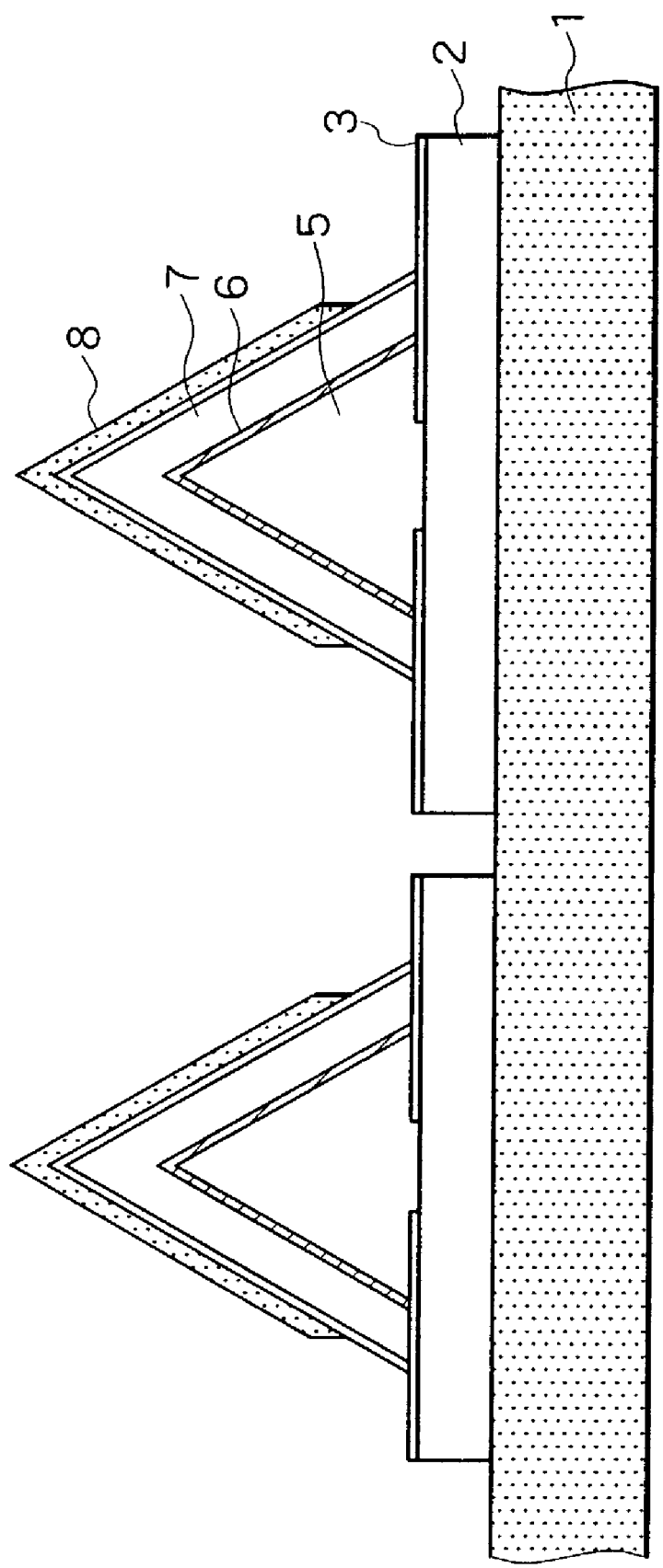
FIG. 4 is a sectional view showing a step of forming an electrode in the method of fabricating a semiconductor light emitting device according to the first embodiment of the present invention.

As shown in FIG. 4, an Ni/Pt/Au or Ni(Pd)/Pt/Au layer is formed on the outermost layer, that is, the magnesium-doped GaN layer 7 grown on the hexagonal pyramid crystal growth layer 5 by vapor-deposition, to form a p-electrode 8. At this time, an n-electrode may be provided by forming an opening portion in part of the mask layer 3 to expose the GaN layer 2 therefrom, and forming a Ti/Al/Pt/Au electrode on the exposed portion of the GaN layer 2 by vapor-deposition.

The semiconductor light emitting devices according to this embodiment, which have been formed by the above-described steps, each have a basic structure as shown in FIG. 4. The light emitting device has the silicon-doped GaN layer 5 formed as a crystal seed layer on the principal plane, taken as the (C+)-plane of sapphire, of the sapphire substrate 1, wherein the silicon-doped GaN layer 5 has the S-planes as the outer planes tilted from the principal plane of the sapphire substrate 1. The InGaN layer 6 is formed as the active layer on the silicon-doped GaN layer 5, wherein the InGaN layer 6 has a shape extending in parallel to the S-planes, and the magnesium-doped GaN layer 7 is formed as the cladding layer on the InGaN layer 6. The p-electrode 8 is formed on the upper surface of the magnesium-doped GaN layer 7. With respect to the n-electrode, if it is provided on the side on which the tilted crystal plane is formed, an opening region is formed in a portion, near the side surface of the hexagonal pyramid portion, of the mask layer 3, and the n-electrode is formed in the opening region. Such an n-electrode is connected to the silicon-doped GaN layer 5 via the silicon-doped GaN layer 2.

The semiconductor light emitting device having such a basic structure is advantageous in that since the device components are formed on the crystal plane tilted from the principal plane of the substrate, it is possible to prevent occurrence of multi-reflection and, hence, to allow light rays emitted from the device to efficiently emerge outwardly from the device.

The semiconductor light emitting devices thus formed on the sapphire substrate 1 are then, as shown in FIG. 4, isolated from each other by RIE (Reactive Ion Etching) or by using a dicer.

Next, steps of forming irregularities on a boundary plane, bonded to the sapphire substrate 1, of the silicon-doped GaN layer 2 as the buffer layer of each of the light emitting devices having the above basic structure, and forming an n-electrode on the irregular surface of the silicon-doped GaN layer 2, to accomplish each of the light emitting devices, will be described with reference to FIGS. 5 to 11. It is to be noted that only one of the number of devices is shown in FIGS. 5 to 11 for the sake of convenience.

Figure 5:
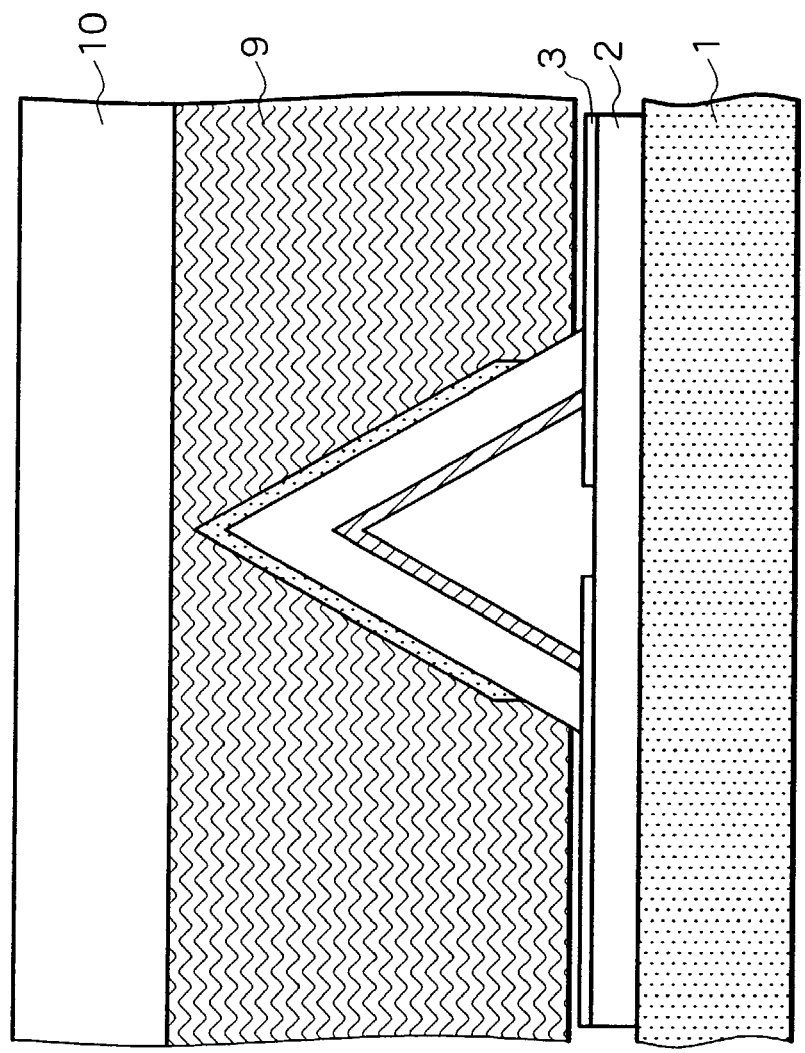
FIG. 5 is a sectional view showing a step of holding each device on a holding substrate in the method of fabricating a semiconductor light emitting device according to the first embodiment of the present invention.

The number of the devices having been formed on the sapphire substrate 1 are, as shown in FIG. 5, held by a temporarily holding substrate 10 coated with an adhesive layer 9 in a state that the adhesive layer 9 is brought into contact with the upper sides of the devices so as to cover nearly the whole of the hexagonal pyramid portions of the devices.

Figure 6:
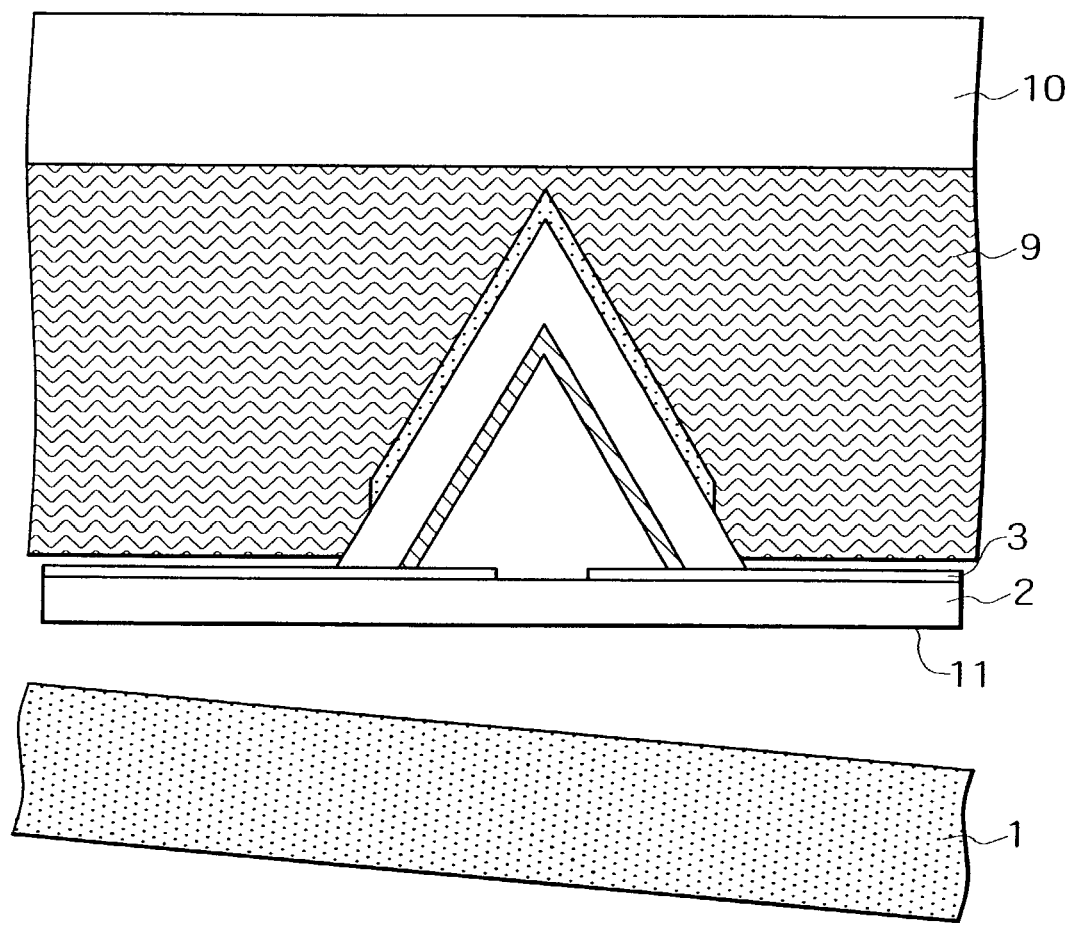
FIG. 6 is a sectional view showing a step of peeling a sapphire substrate from the device in the method of fabricating a semiconductor light emitting device according to the first embodiment of the present invention.

Each of the light emitting devices is, as shown in FIG. 6, irradiated with energy beams; for example, high output pulse ultraviolet laser beams such as excimer laser beams having passed through the sapphire substrate 1 from the back side to the front side thereof. By the irradiation of the high output pulse ultraviolet laser beams, in the vicinity of the interface between the sapphire substrate 1 and the silicon-doped GaN layer 2 as the crystal layer, gallium nitride (GaN) of the silicon-doped GaN layer 2 is decomposed into nitrogen gas and gallium, so that a bonding force between the GaN layer 2 and the sapphire substrate 1 becomes weak. As a result, the sapphire substrate 1 easily can be peeled from the silicon-doped GaN layer 2 as the crystal layer of each of the light emitting devices. At this time, by optimizing the irradiation condition of the excimer laser beams, irregularities can be formed on the silicon-doped GaN layer 2 simultaneously with the peeling of the substrate 1 from the GaN layer 2.

After the sapphire substrate 1 is peeled from the GaN layers 2 of the light emitting devices, the light emitting devices are held in a state being isolated from each other by the adhesive layer 9 of the temporarily holding substrate 10. At this time, a plane 11, which has been bonded to the sapphire substrate 1, of each GaN layer 2 is exposed.

Figure 7:
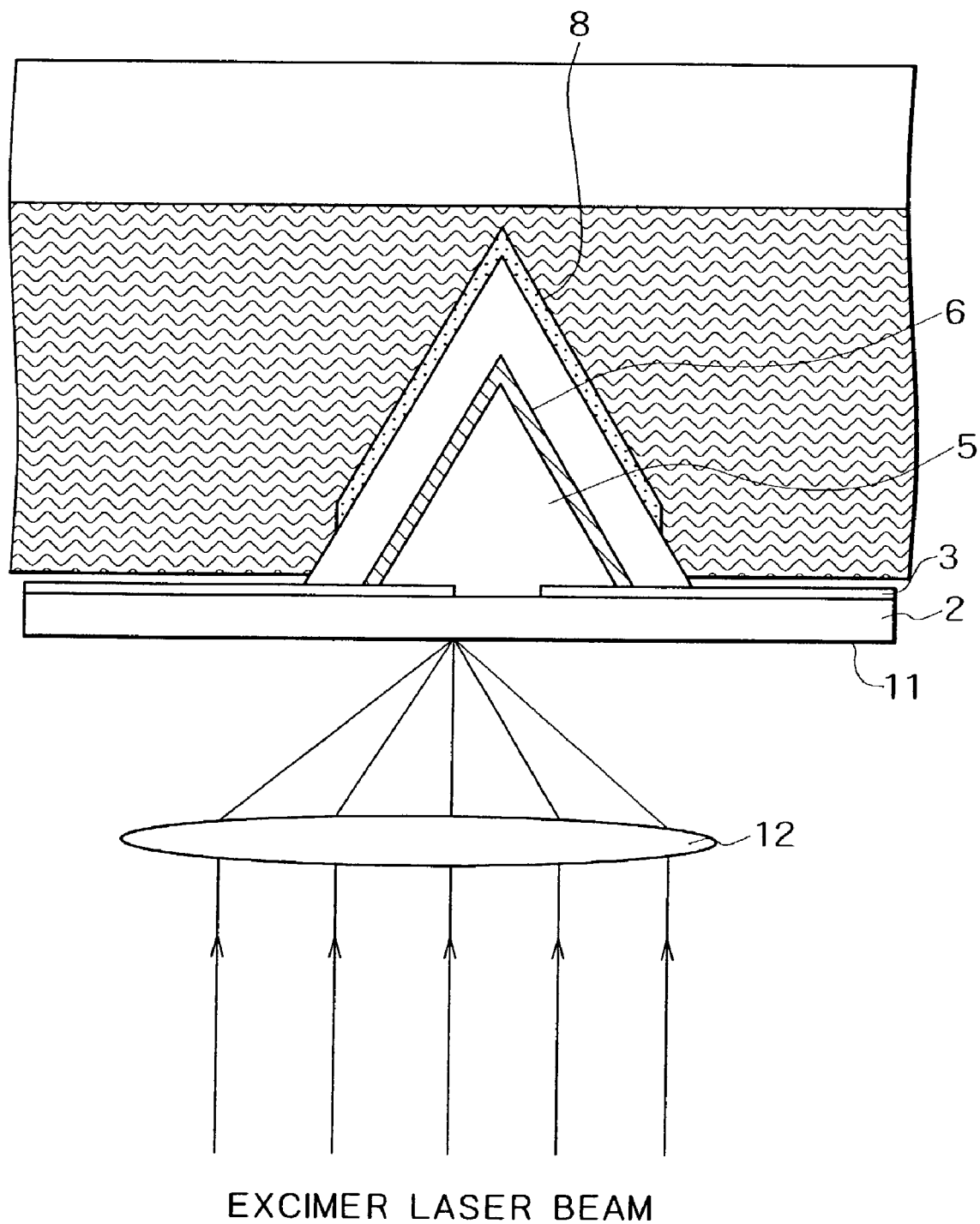
FIG. 7 is a sectional view showing a step of forming irregularities on a crystal growth layer of the device by irradiating the crystal layer with laser beams in the method of fabricating a semiconductor light emitting device according to the first embodiment of the present invention.
Figure 8:
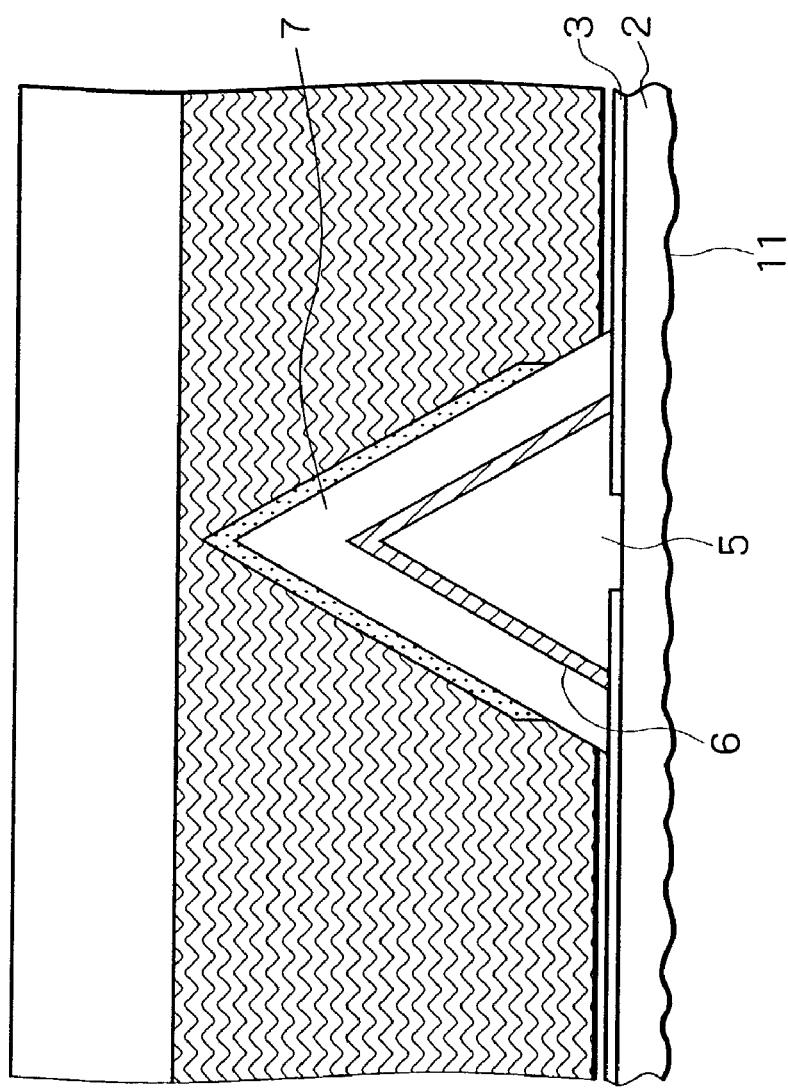
FIG. 8 is a sectional view showing a step of forming irregularities on a back plane of the crystal growth layer of the device in the method of fabricating a semiconductor light emitting device according to the first embodiment of the present invention.

The step of forming irregularities on the plane 11 of the GaN layer 2 will be described in detail with reference to FIGS. 7 and 8.

To allow light rays emitted from the semiconductor light emitting device to efficiently emerge outwardly from the device, it may be desirable to form fine irregularities on the plane 11 as an emergence plane of light produced in the device. In the light emitting device, light rays are produced from the InGaN layer 6 as the light emission region located over the silicon-doped GaN layer 2. Part of the light rays are made directly incident on the plane 11, and the remaining part of the light rays are reflected from the p-electrode 8 and are made incident on the plane 11 at incident angles in a wide range. The fine irregularities formed on the plane 11 is effective to prevent such light rays incident to the plane 11 from being totally reflected from the plane 11.

The formation of the irregularities on the flat plane 11 is made by irradiating the plane 11 with energy beams, thereby decomposing gallium nitride of a lower portion, near the plane 11, of the GaN layer 2 (see FIG. 6). As the energy beams, for example, there can be used high output pulse ultraviolet laser beams such as excimer laser beams. The plane 11 may be directly irradiated with excimer laser beams emitted from an excimer laser generator. More preferably, as shown in FIG. 7, excimer laser beams may be converged once through a convex lens 12 to be focused at a spot on the plane 11. With this configuration, a higher output power can be concentrated at the spot on the plane 11, to form one irregularity at the spot on the plane 11 for a short time. Further, by moving the focus on the plane 11, irregularities can be formed over the plane 11 (see FIG. 8).

Figure 9:
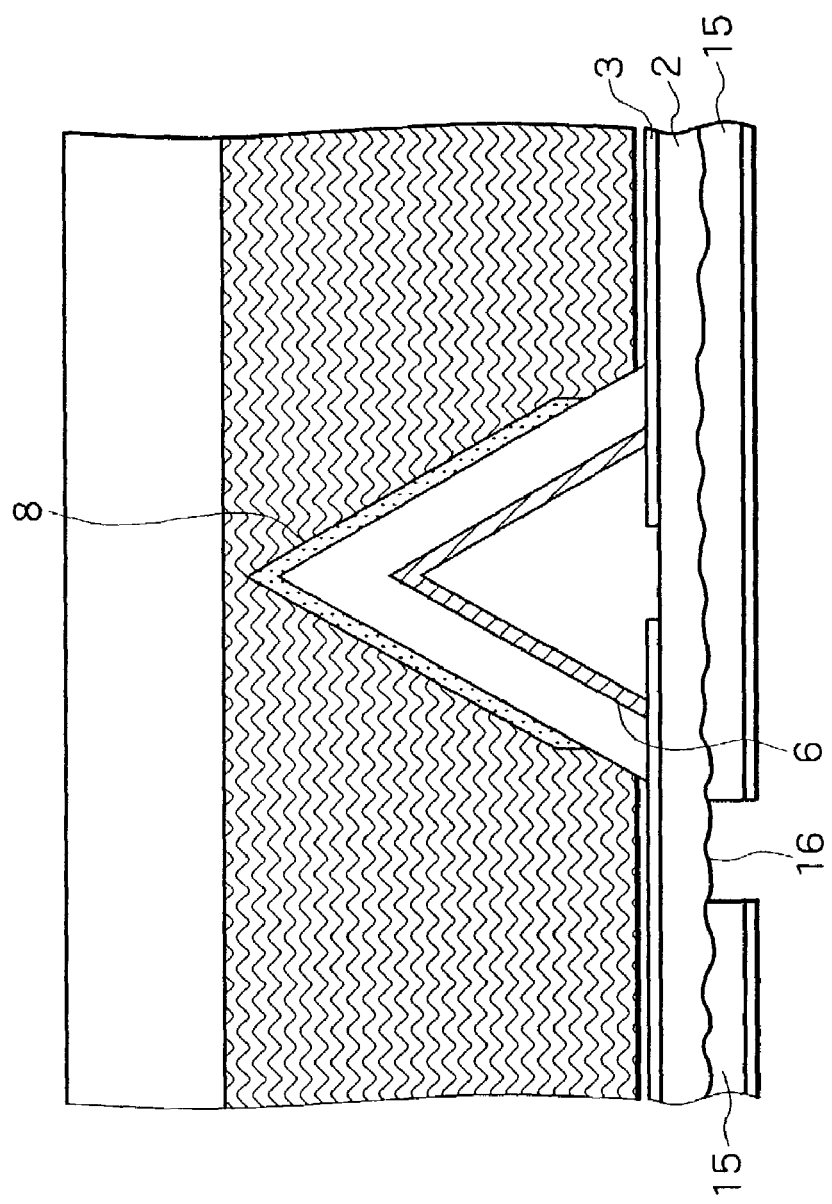
FIG. 9 is a sectional view showing a step of forming a mask in the method of fabricating a semiconductor light emitting device according to the first embodiment of the present invention.
Figure 10:
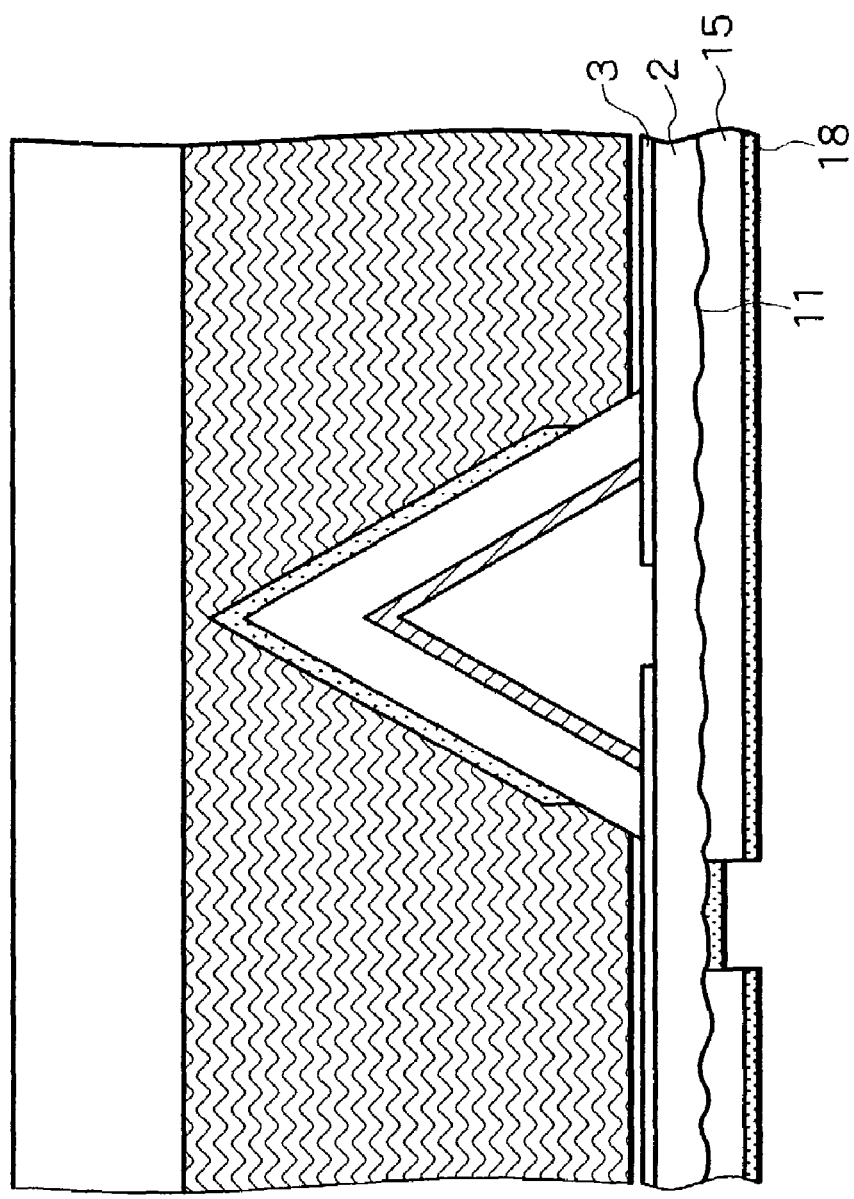
FIG. 10 is a sectional view showing a step of forming an n-electrode in the method of fabricating a semiconductor light emitting device according to the first embodiment of the present invention.
Figure 11:
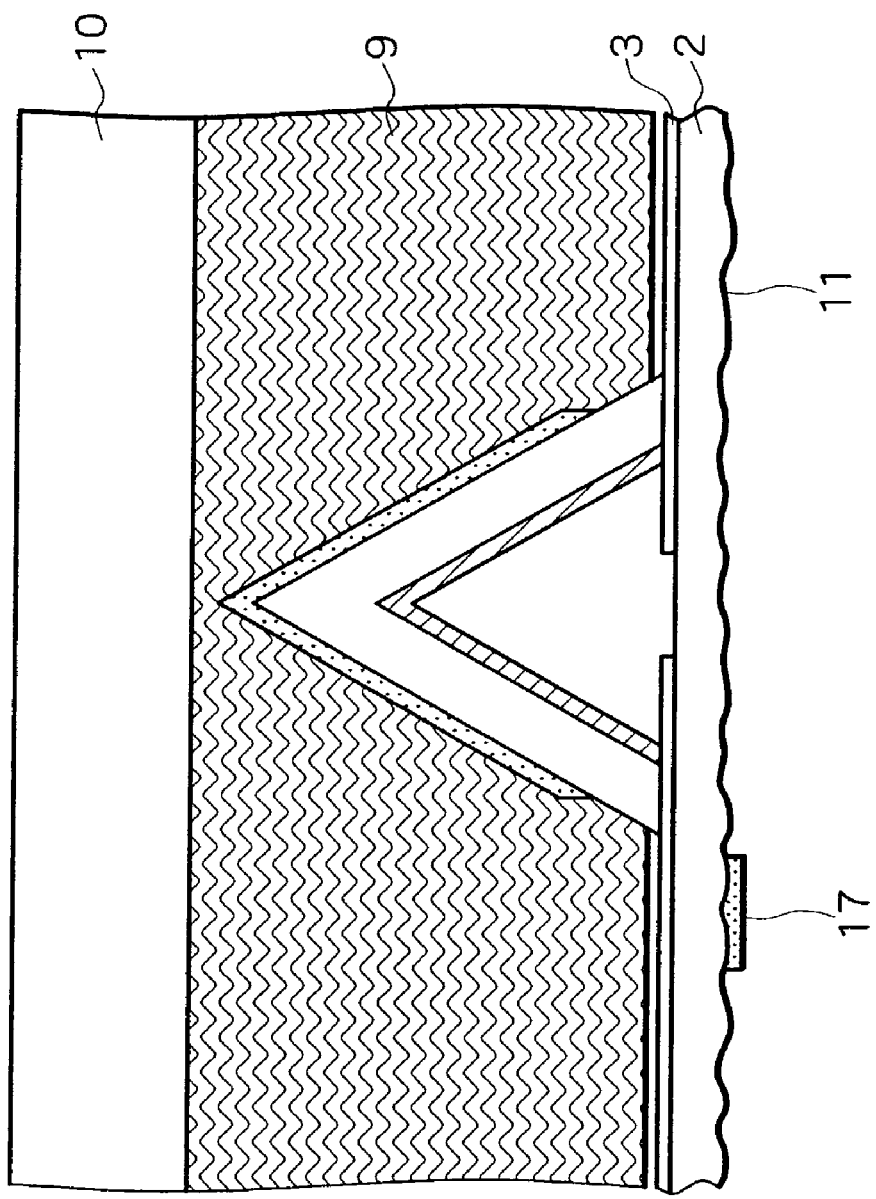
FIG. 11 is a sectional view showing the structure of the device accomplished by the method of fabricating a semiconductor light emitting device according to the first embodiment of the present invention.

The step of forming an n-electrode on the plane 11, on which the irregularities have been formed, by a so-called lift-off method will be described below. As shown in FIG. 9, the plane 11 on which the irregularities have been formed is coated with a photoresist layer 15, and an approximately rectangular opening portion 16 is formed in the photoresist layer 15 by exposure and development. The depth of the opening portion 16 is set such that the plane 11 is exposed from the opening portion 16. It is to be noted that the opening portion 16 is located at a position apart from a region directly under the InGaN layer 6 as the light emission region and the P-electrode 8 having the function for reflecting light emitted from the InGaN layer 6. As shown in FIG. 10, Ti/Al/Pt/Au is vapor-deposited over the entire photoresist layer 15 including the opening portion 16, to form a metal thin layer 18. The photoresist layer 15 is then removed by a solvent, with a result that as shown in FIG. 11, the metal thin layer 18 made from Ti/Al/Pt/Au remains only at the position in the opening portion 16. The remaining metal thin layer is taken as an n-electrode 17. Since the n-electrode 17 is made from a metal not allowing light to pass therethrough, it must be formed at a position apart from a light emergence region.

The formation of the n-electrode 17 on the plane 11 having irregularities is advantageous in that as compared with the formation of the n-electrode on a flat plane, the contact area between the n-electrode 17 and the plane 11 becomes substantially larger, to reduce the current density.

In the case of fabricating an apparatus such as an image display unit or a lighting apparatus by arraying the above-described semiconductor light emitting devices on a board on the apparatus side, all of the devices held by the adhesive layer 9 may be arrayed at desired positions of the board on the apparatus side and then separated from the adhesive layer 9. Alternatively, part of the devices located at specific positions of the sapphire substrate 1 may be separated from the sapphire substrate 1 by selectively irradiating the devices with excimer laser beams, and arrayed at desired positions of the board on the apparatus side.

[Second Embodiment]

Figure 12:
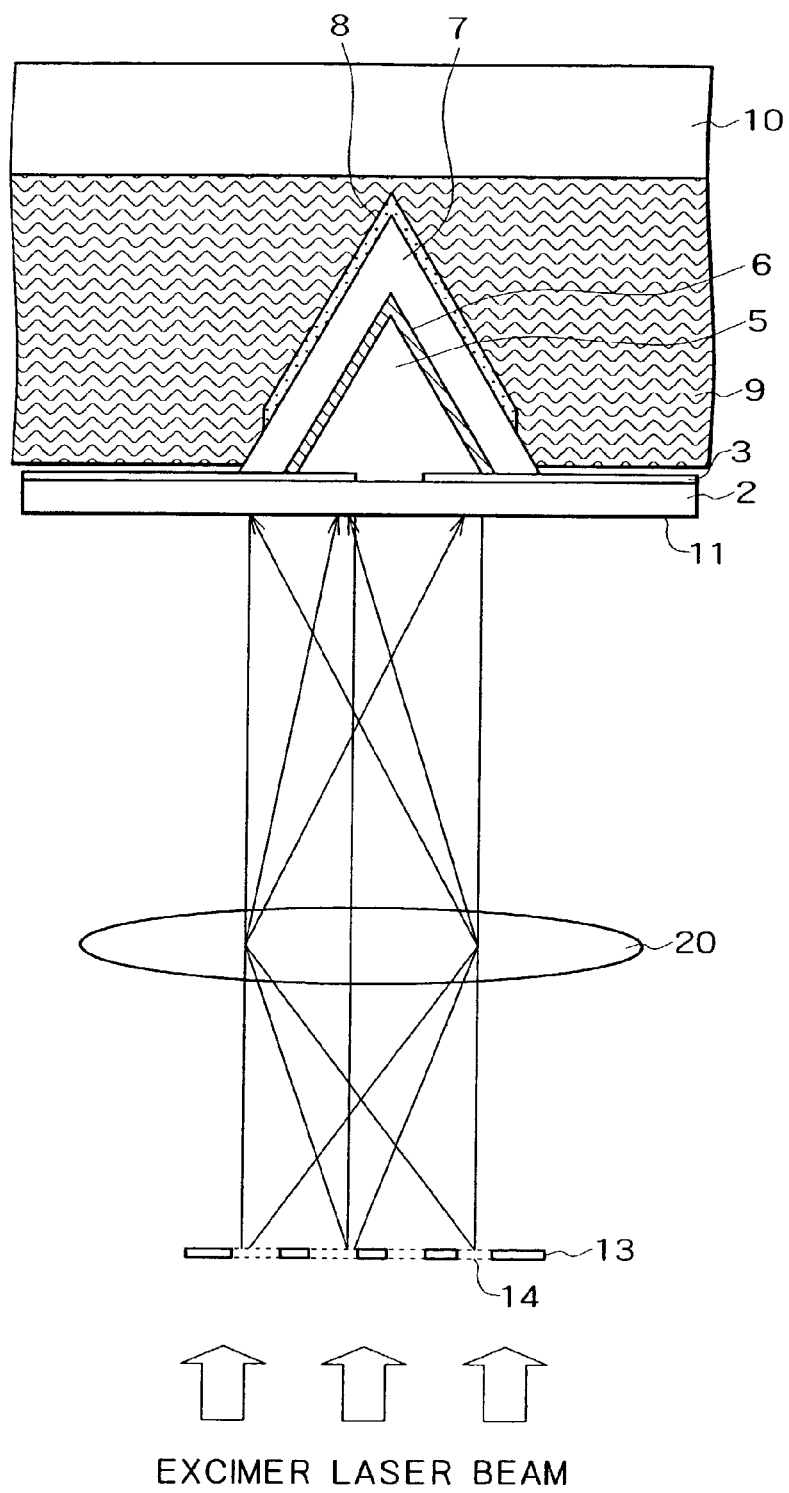
FIG. 12 is a sectional view showing a step of forming irregularities on a crystal growth layer by irradiating the crystal growth layer with laser beams in a method of fabricating a semiconductor light emitting device according to a second embodiment of the present invention.

A second embodiment of the present invention will be described with reference to FIG. 12. This embodiment relates to another method of forming irregularities using energy beams.

The method according to this embodiment is effective to more easily form irregularities for a shorter time as compared with the method according to the first embodiment. It is to be noted that steps of forming light emitting devices by crystal growth and peeling a sapphire substrate from a silicon-doped GaN layer of each of the light emitting devices, and a step of forming an n-electrode are the same as those described in the first embodiment. Therefore, the overlapped description thereof is omitted. Also, parts corresponding to those in the first embodiment are denoted by the same reference numerals whereby the overlapped description thereof is omitted as well.

A projection lens 20 is disposed between a mask 13 not allowing excimer laser beams to pass therethrough and each light emitting device from which a sapphire substrate 1 has been separated. The positional relationship between the projection lens 20 and the mask 13 is determined such that an image of the mask 13 is formed on a plane 11; that is, a back plane of a silicon-doped GaN layer 2. It is to be noted that the mask 13 is made from a material having good resistance to deterioration by irradiation of excimer laser beams. Fine opening portions 14 are formed at random in the mask 13. The diameter of each of the opening portions 14 and the number of the opening portions 14 formed in the mask 13 may be set under an optimum condition, which is determined depending on various requirements such as sizes of irregularities formed on the plane 11, the energy density of excimer laser beams, the production efficiency, and the like. The shape of the opening portion 14 may be selected from a circular shape, a rectangular shape, a triangular shape, a hexagonal shape, and similar shapes thereto.

Excimer laser beams, emitted to the mask 13 from the side opposite to the plane 11, pass through the opening portions 14, to be thus divided into a number of sets of beams. Accordingly, unlike the first embodiment, a number of spots on the plane 11 can be simultaneously irradiated with the number of sets of beams, so that a number of irregularities can be simultaneously and efficiently formed on the plane 11.

According to one variation of this embodiment, by combining the method described in this embodiment with the method described in the first embodiment, a number of fine irregularities can be simultaneously formed. For example, the mask 13 in this embodiment may be modified such that a fine convex lens similar to that described in the first embodiment may be formed in each of the opening portions 14 of the mask 13. With this configuration, excimer laser beams emitted to the mask 13 pass through the opening portions 14 to be divided into a number of sets of beams, and in this case, such divided sets of beams are converged through the convex lens. As a result, a number of spots on the plane 11 are simultaneously irradiated with the excimer laser beams having a high energy density per area, so that it is possible to further efficiently form fine irregularities on the plane 11.

[Third Embodiment]

A third embodiment of the present invention will be described with reference to FIGS. 13 to 22. In this embodiment, irregularities are previously formed on a principal plane of a substrate, and a crystal layer of a semiconductor light emitting device is grown on the principal plane having the irregularities.

A sapphire substrate generally used for crystal growth of a nitride semiconductor is used in this embodiment, but it may be replaced with another kind of substrate. For example, a nitride semiconductor substrate can be used as the substrate in this embodiment.

Figure 13:
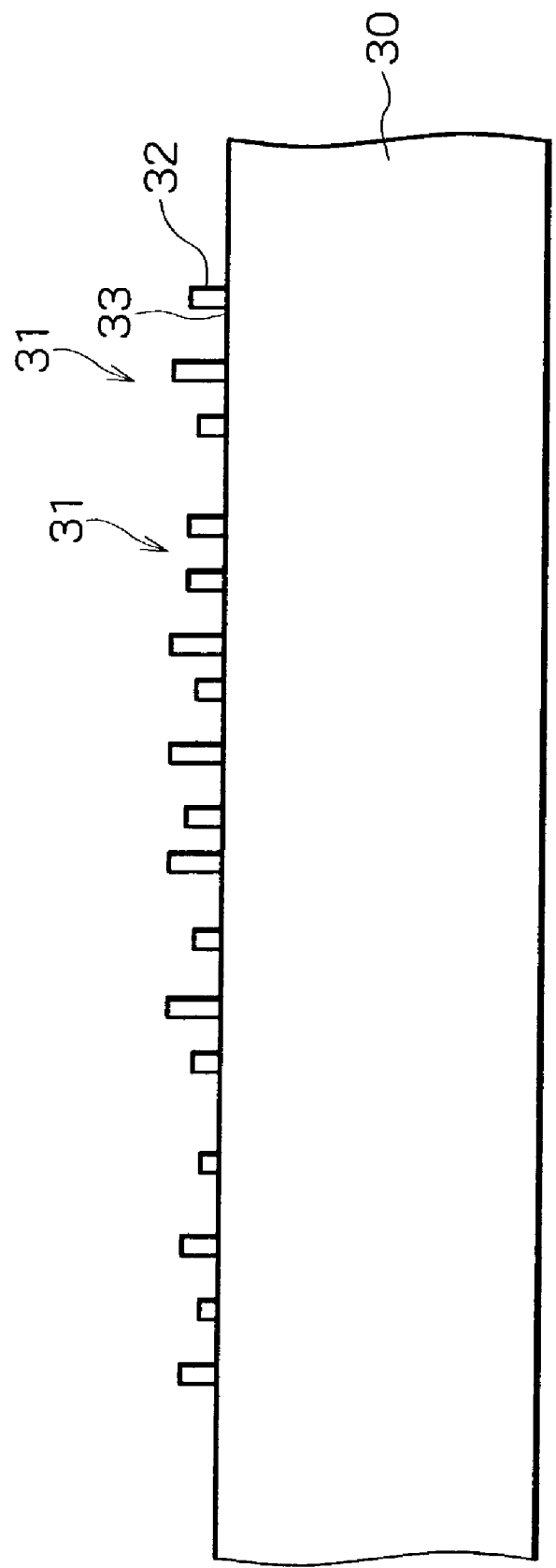
FIG. 13 is a sectional view showing a step of forming irregularities on a sapphire substrate in a method of fabricating a semiconductor light emitting device according to a third embodiment of the present invention.

First, as shown in FIG. 13, irregularities 31 are formed on a principal plane, taken as (C+)-plane of sapphire, of a sapphire substrate 30 by reactive ion etching or by using hydrofluoric acid as an etchant. The irregularities 31 may be formed by polishing the principal plane of the sapphire substrate 30 by using a material having a high hardness such as diamond, to form a number of fine depressions 33 and fine projections 32.

The roughness of the irregularities 31 may be set to a value capable of satisfying the object of the present invention; that is, capable of reducing total reflection of light and allowing a sufficient quantity of light to emerge outwardly from the device by scattering of light from the irregularities 31. The projections 32 may be somewhat tilted from the vertical line extending in the direction perpendicular to the bottom plane of the depressions 33. The depths of the depressions 33 may be different from each other, and the heights of the projections 32 may be different from each other. In addition, the irregularities 31 may be formed by combining the above described methods with each other.

Figure 14:
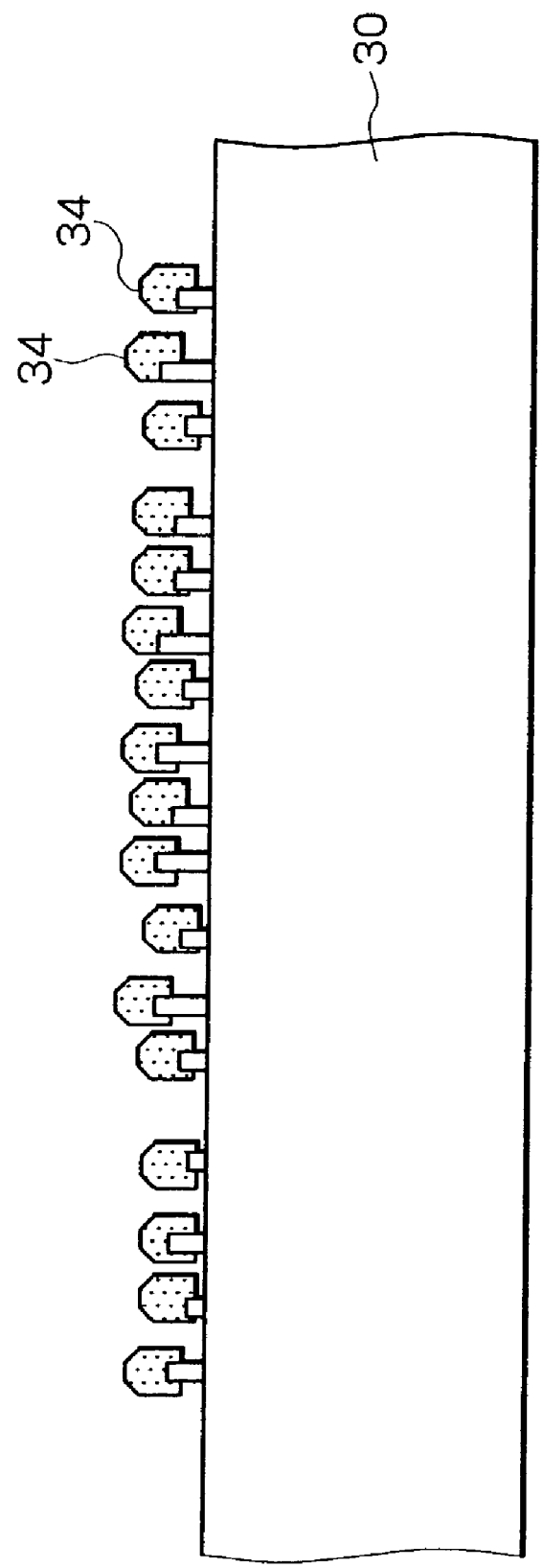
FIG. 14 is a sectional view showing a step of forming a crystal growth layer on the irregularities on the sapphire substrate in the method of fabricating a semiconductor light emitting device according to the third embodiment of the present invention.

The sapphire substrate 30 having the principal plane having the irregularities 31 is put in an organo-metal vapor-phase deposition system. The temperature of the inside of the deposition system is increased while ammonia as a nitrogen source and hydrogen and nitrogen as carrier gases are supplied in the deposition system. When the temperature reaches about 1000° C., trimethyl gallium as a Ga source is supplied in the deposition system to start crystal growth, thereby forming the projections 33 as shown in FIG. 13. Lateral growth then occurs at each of the projections 33. Consequently, as shown in FIG. 14, a GaN layer portion 34 is formed in such a manner as to cover the upper end of each of the projections 32. On the other hand, the upper side of each of the depressions 33 is closed by the GaN layer portions 34 grown on the upper ends of the projections 32 located on both sides of the depression 33. As a result, the depressions 33 become voids.

Figure 15:
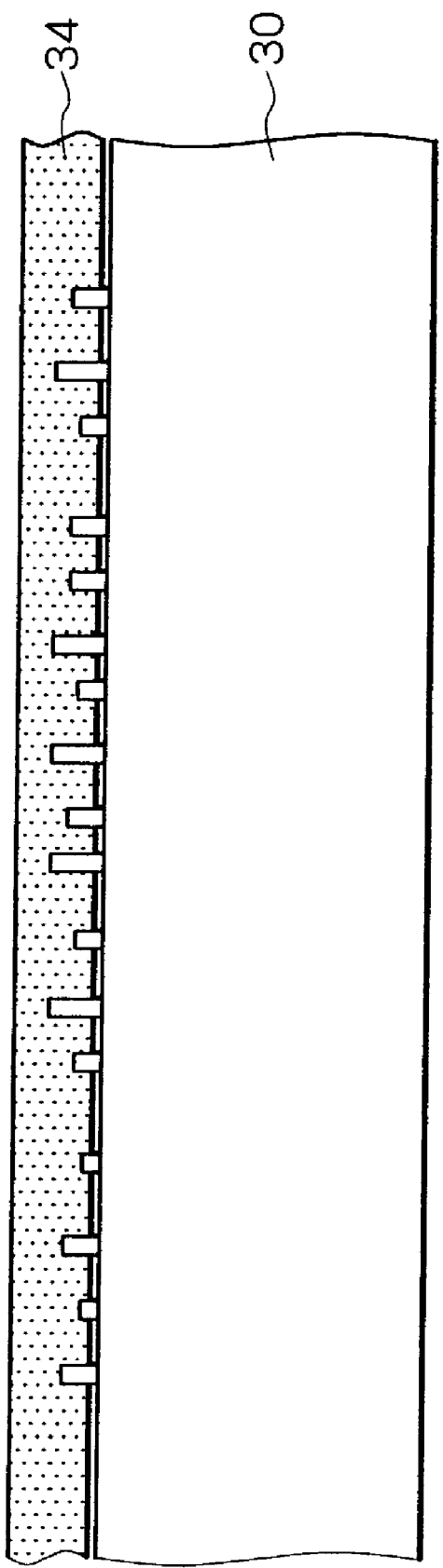
FIG. 15 is a sectional view showing a step of growing the crystal growth layer on the irregularities in the lateral direction in the method of fabricating a semiconductor light emitting device according to the third embodiment of the present invention.
Figure 16:
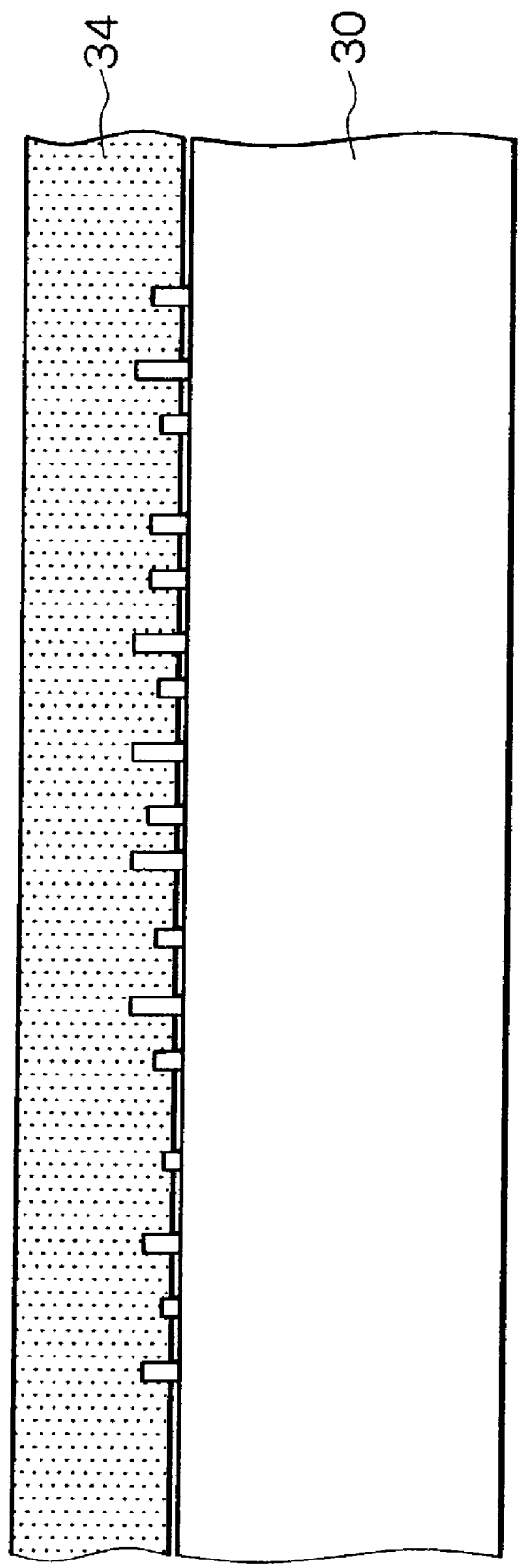
FIG. 16 is a sectional view showing a step of growing the crystal growth layer on the irregularities in the thickness direction in the method of fabricating a semiconductor light emitting device according to the third embodiment of the present invention.

The GaN layer portions 34 grown on the upper ends of the projections 32 are further grown in the lateral direction to be joined to each other as shown in FIG. 15, and finally, the GaN layer portions 34 bonded to each other in the lateral direction are then grown in the thickness direction to form a GaN layer 34 as shown in FIG. 16.

Figure 17:
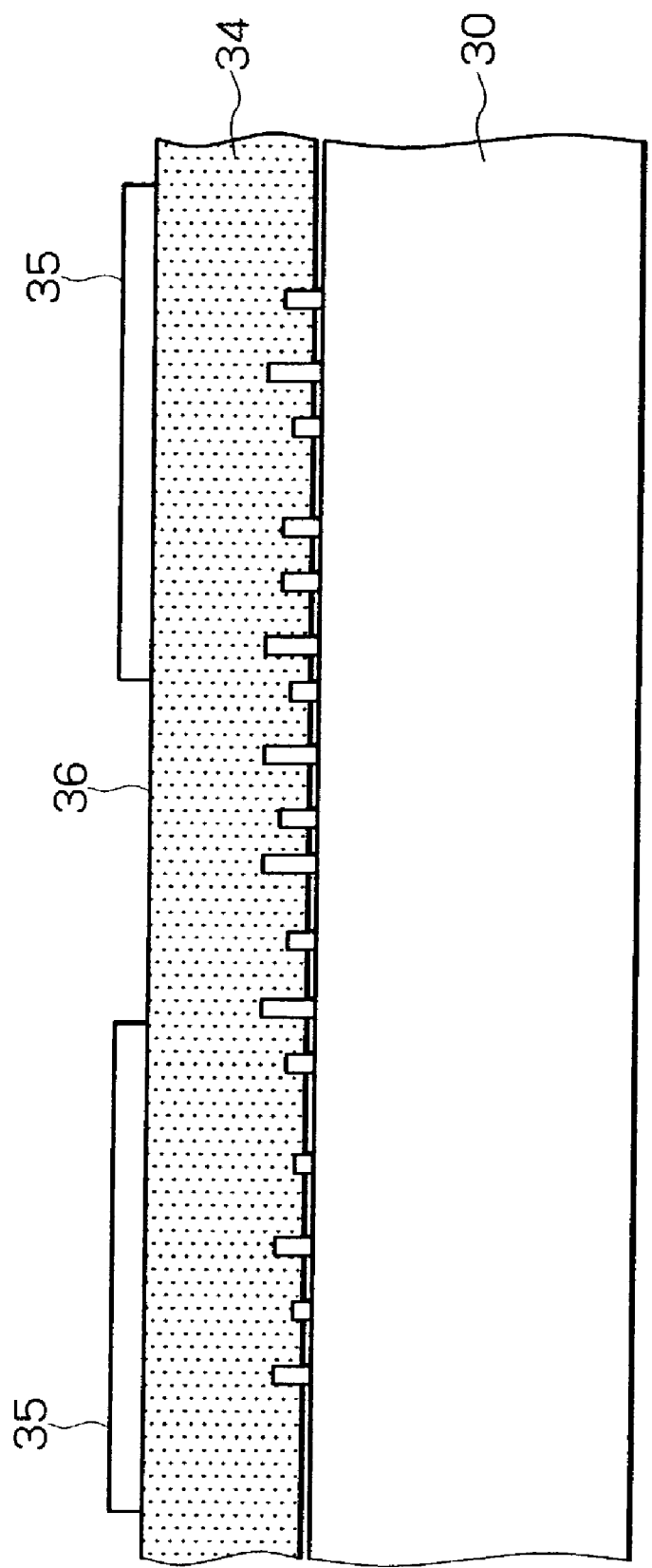
FIG. 17 is a sectional view showing a step of forming a mask in the method of fabricating a semiconductor light emitting device according to the third embodiment of the present invention.
Figure 18:
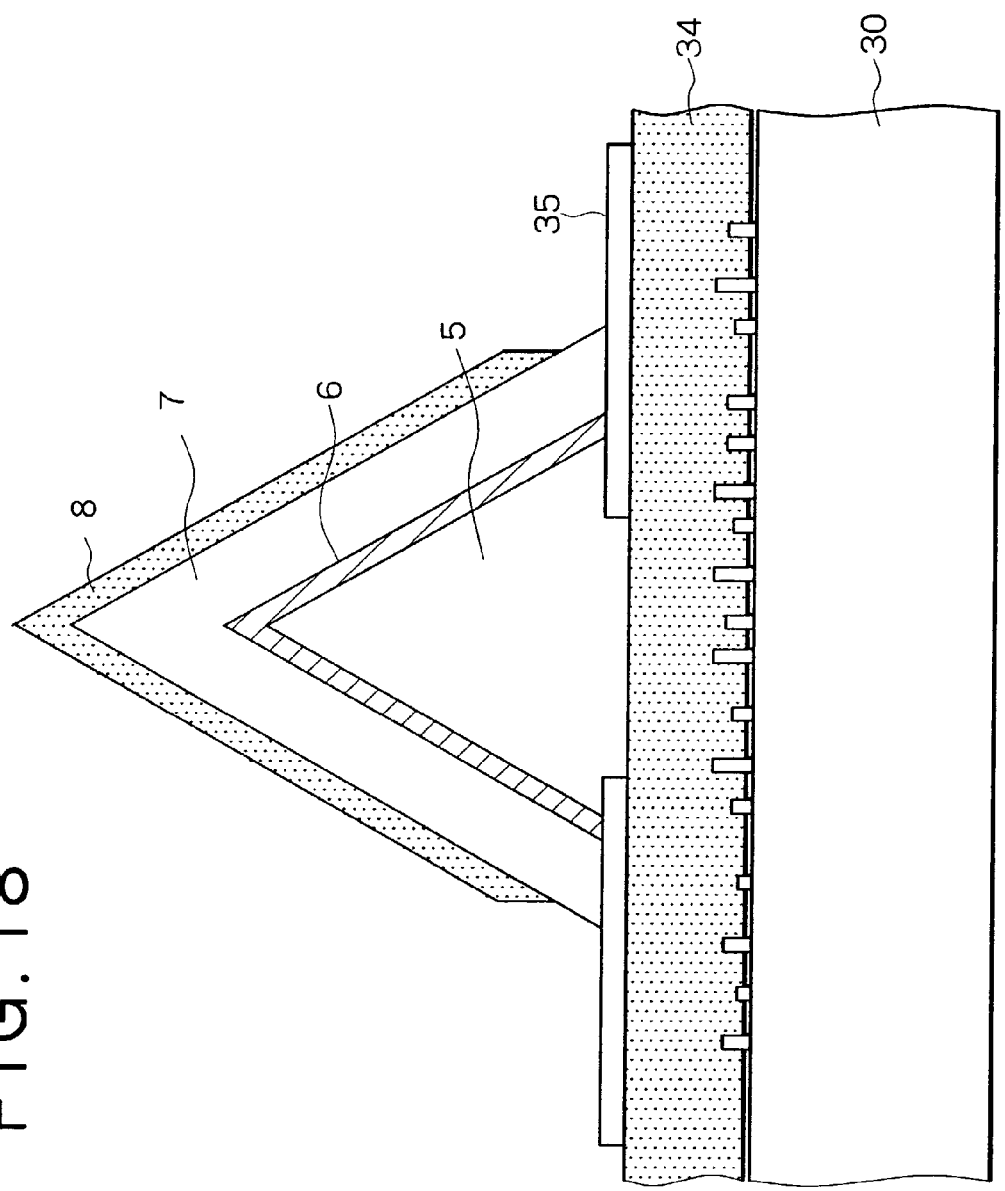
FIG. 18 is a sectional view showing a step of forming an electrode in the method of fabricating a semiconductor light emitting device according to the third embodiment of the present invention.

As shown in FIG. 17, a mask layer 35 made from $SiO_2$ or SiN is formed to a thickness ranging from 100 nm to 500 nm over the entire surface of the GaN layer 34. A window region 36 composed of a circular opening portion having a size of about 10 μm is formed in the mask layer 35 by photolithography and etching using hydrofluoric acid as an etchant. After that, a first conductive type layer, an active layer, a second conductive type layer, and a p-electrode are formed in the same manner as that described in the first embodiment to form a light emitting device on the sapphire substrate 30 having the irregularities as shown in FIG. 18. At this time, an n-electrode may be provided by forming an opening portion in part of the mask layer 35 to expose the GaN layer 34 therefrom, and forming an electrode layer on the exposed portion of the GaN layer 34 by vapor-deposition. The device isolation also may be performed by cutting the mask layer 35 and the GaN layer 34 by etching or using a dicer.

Figure 19:
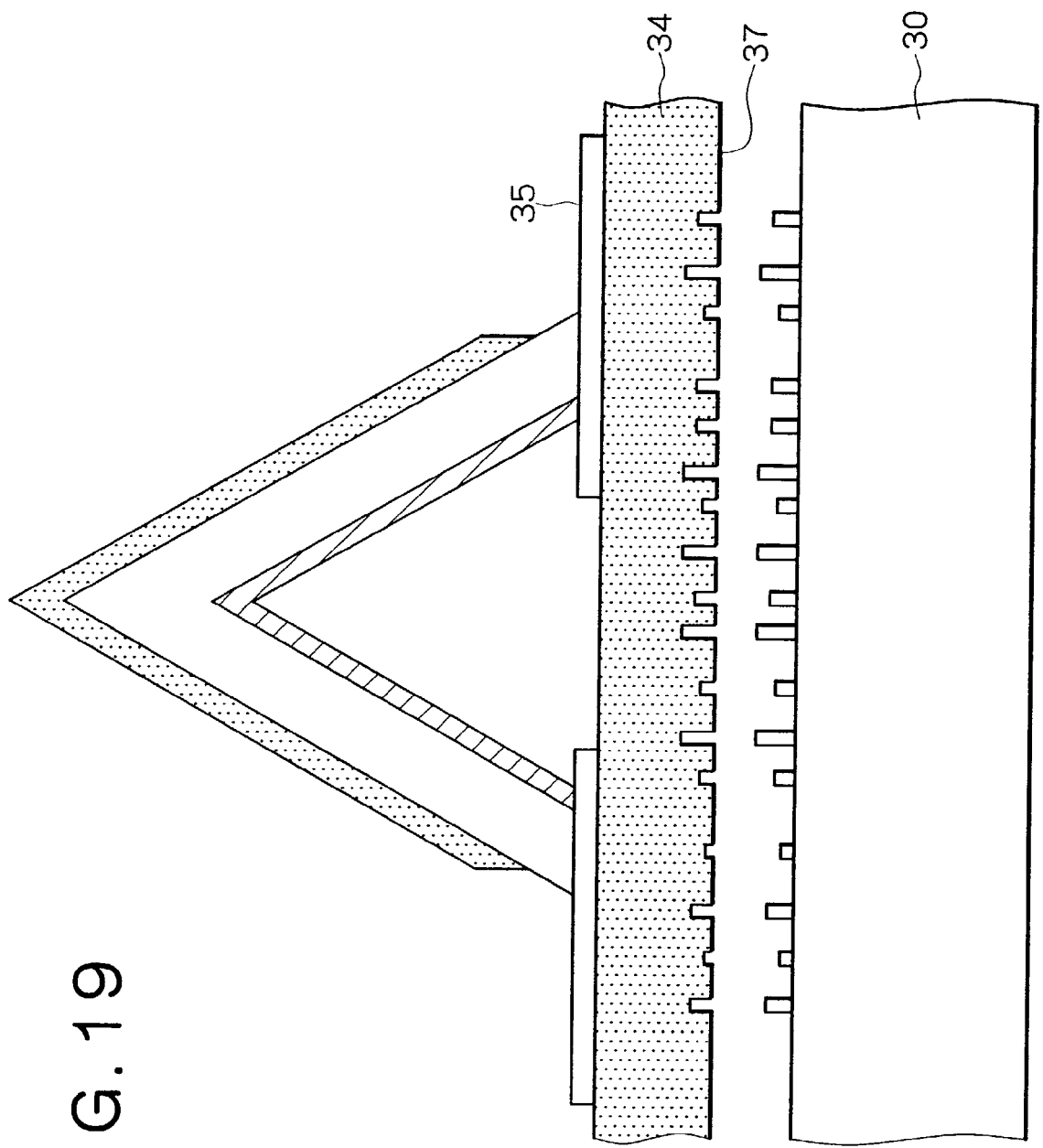
FIG. 19 is a sectional view showing a step of peeling the sapphire substrate from the device in the method of fabricating a semiconductor light emitting device according to the third embodiment of the present invention.
Figure 20:
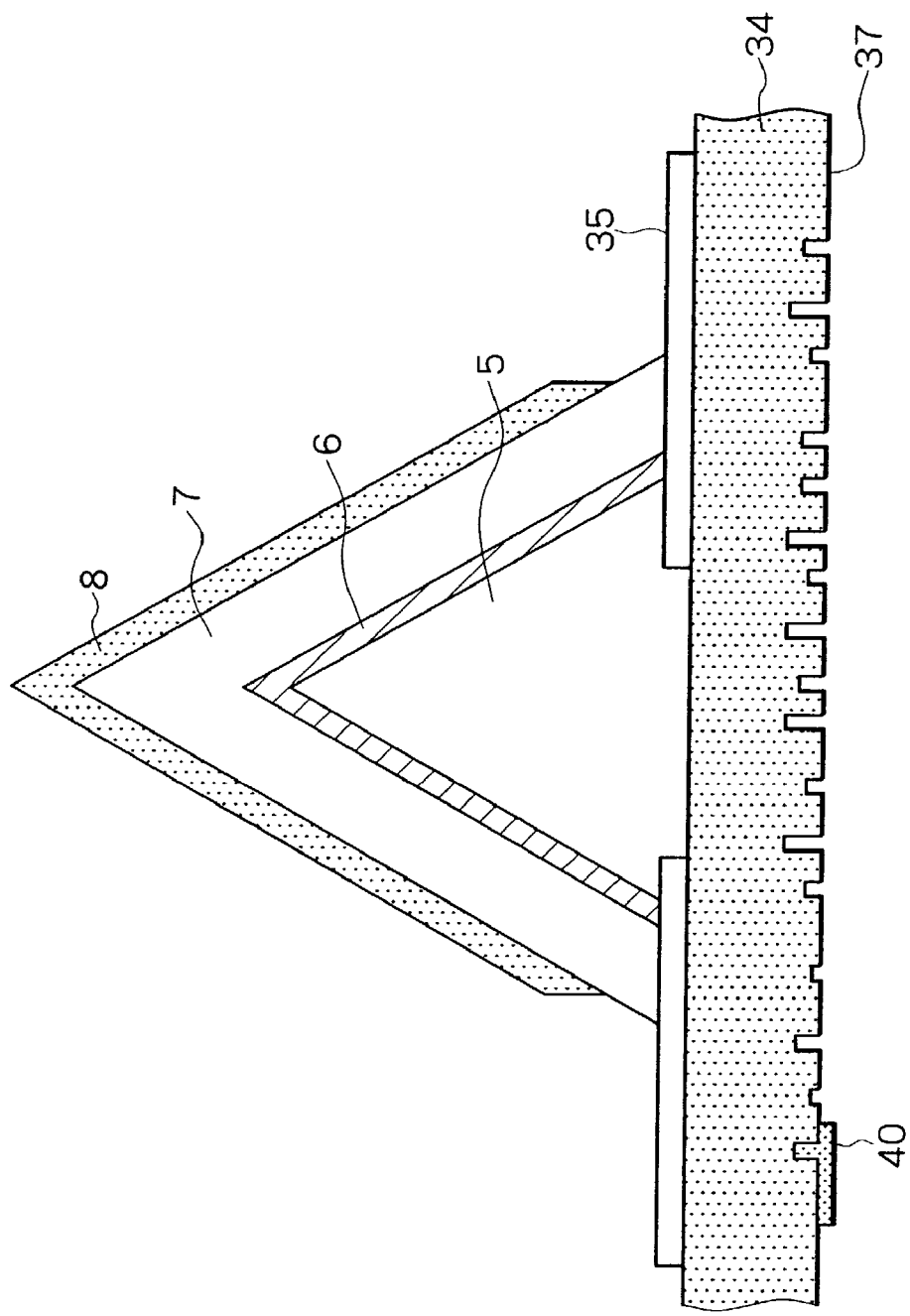
FIG. 20 is a sectional view showing the structure of the device accomplished by the method of fabricating a semiconductor light emitting device according to the third embodiment of the present invention.

Each of the light emitting devices is irradiated with energy beams; for example, high output pulse ultraviolet laser beams such as excimer laser beams having passed through the sapphire substrate 30 from the back side to the front side thereof. By the irradiation of the high output pulse ultraviolet laser beams, in the vicinity of the interface between the sapphire substrate 30 and the GaN layer 34 as the crystal layer, gallium nitride (GaN) of the GaN layer 34 is decomposed into nitrogen gas and gallium so that a bonding force between the GaN layer 34 and the sapphire substrate 30 becomes weak. As a result, the sapphire substrate 30 easily can be peeled from the GaN layer 34 as the crystal layer of each of the light emitting devices as shown in FIG. 19. The irregularities thus can be formed on a plane 37, which is a light emergence plane, of the GaN layer 34.

The step of forming an n-electrode on the plane 37, on which the irregularities have been formed, by the lift-off method will be described below. It is to be noted that the lift-off method in this embodiment is similar to that described in the first embodiment with reference to FIGS. 9, 10 and 11.

The plane 37 on which the irregularities have been formed is coated with a photoresist layer, and an approximately rectangular opening portion is formed in the photoresist layer by exposure and development. The depth of the opening portion is set such that the plane 37 is exposed from the opening portion. It is to be noted that the opening portion is located at a position apart from a region directly under the InGaN layer 6 as the light emission region and the P-electrode 8 having the function for reflecting light emitted from the InGaN layer 6. Then, Ti/Al/Pt/Au is vapor-deposited over the entire photoresist layer including the opening portion to form a metal thin layer. The photoresist layer is then removed by a solvent, with a result as that shown in FIG. 20, the metal thin layer made from Ti/Al/Pt/Au remains only at the position in the opening portion. The remaining metal thin layer is taken as an n-electrode 40. Since the n-electrode 40 is made from a metal not allowing light to pass therethrough, it must be formed at a position apart from a light emergence region. In addition, a transparent electrode made from ITO (Indium Tin Oxide) may be formed on a position directly under the active layer 6 of the plane 37.

The formation of the n-electrode 40 on the plane 37 having irregularities is advantageous in that as compared with the formation of the n-electrode on a flat plane, the contact area between the n-electrode 40 and the plane 37 becomes substantially larger, to reduce the current density.

[Fourth Embodiment]

A fourth embodiment of the present invention will be described with reference to FIG. 21. This embodiment relates to an image display unit and a lighting apparatus in each of which a number of semiconductor light emitting devices have irregularities on a back plane of a crystal growth layer. In this embodiment, description will be made by example of an image display unit including devices each having a crystal growth layer whose plane is tilted from the principal plane of a substrate and devices each having a crystal growth layer whose plane is parallel to the principal plane of the substrate. In addition, the semiconductor light emitting device including a crystal growth layer whose plane is tilted from the principal plane of a substrate is fabricated by the method described in each of the first, second, and third embodiments.

Figure 21:
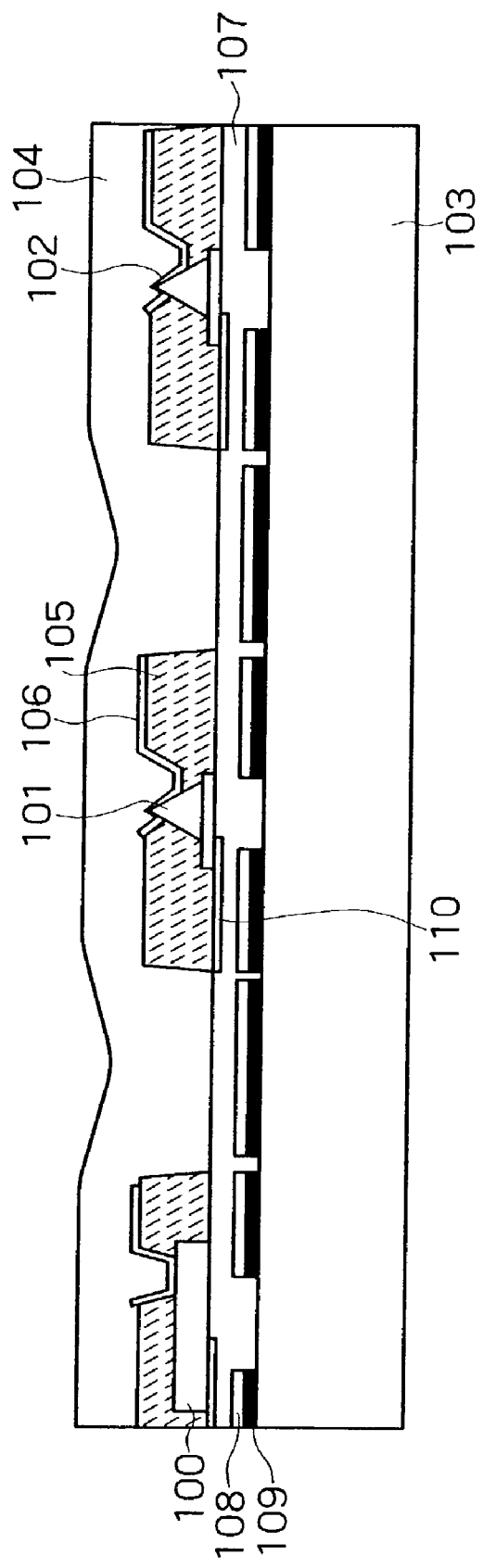
FIG. 21 is a sectional view of an image display unit according to a fourth embodiment of the present invention, showing a state that semiconductor light emitting devices are arrayed.

FIG. 21 is a sectional view showing one pixel region of an image display unit, wherein three light emitting devices are arrayed in the pixel region. As shown in FIG. 21, light emitting diodes 100, 101, and 102 for emission of light of three colors (R, G, B) are arrayed on a substrate 103 and are coated with an insulating layer 104. The insulating layer 104 may be made from a transparent epoxy adhesive, a UV-curing type adhesive, or polyimide. The shapes of the diodes 100, 101, and 102 are not necessarily identical to each other. The light emitting diode 100 for emission of red light has a structure with no hexagonal pyramid shaped GaN layer, and each of the light emitting diodes 101 for emission of green light and the light emitting diode 102 for emission of blue light has a structure having a hexagonal pyramid shaped GaN layer. The crystal growth method, device structure, and material differ depending on a desired color of light emission and, correspondingly, the device shape is varied.

To handle the light emitting diodes different in device structure in the same manner, each of the light emitting diodes is covered with an adhesive layer 105 made from a resin, to be formed into a resin-covered chip having the same shape. Part of the adhesive layer 105 of the resin-covered chip is removed, and an electrode pad 106 for connecting an electrode to a circuit is formed so as to be connected to the electrode. An n-electrode 110 is formed on a back plane, having irregularities, of each of the light emitting diodes 100, 101, and 102.

The substrate 103 may be a light permeable substrate allowing visible light, infrared light, or a light energy such as a laser beam to pass therethrough; for example, a glass substrate, a quartz glass substrate, or a plastic substrate. A thermoplastic resin layer 107, which is used for adhesively bonding the resin-covered chip to the substrate 103, may be made from polyolefine, polyvinyl chloride, polyamide, or polyester. An electrode layer 108 for supplying a power to each of the light emitting diodes is made from a metal or a metal silicide, and a black chromium layer 109 as an electromagnetic wave absorbing layer is formed on the surface, on the screen side, that is, on the viewer side, of the electrode layer 108. The black chromium layer 109 functions as a shadow mask for improving the contrast of an image.

Finally, wiring lines are connected to upper side electrodes of the light emitting diodes arrayed on the substrate 103 to accomplish a display panel of the image display unit.

According to the image display unit in this embodiment, since the irregularities are formed on the back plane of each of the light emitting diodes, it is possible to improve the light emergence efficiency and, hence, to enhance of the image quality of the image display unit.

As described above, the semiconductor light emitting device and the fabrication method thereof are advantageous in that since irregularities are formed on a back plane as a light emergence plane of a crystal growth layer, part of light rays generated in a light emission region, the emergence of which has been regarded as difficult due to total reflection from the light emergence plane, are allowed to emerge outwardly from the device, and that since light rays are scattered from the irregularities, it is possible to increase the light emergence efficiency.

The semiconductor light emitting device and the fabrication method thereof are also advantageous in that since irregularities are formed on a back plane of a crystal growth layer as an n-type semiconductor layer, and an n-electrode is formed on the plane having the irregularities, the contact area between the n-electrode and the crystal growth layer becomes substantially larger, with a result that as compared with the case where the electrode is formed on a flat plane, the current density can be reduced. Additionally, by forming the n-electrode at a position apart from a light emergence region or forming a transparent electrode as the n-electrode, the above effect can be obtained without reducing the light emergence efficiency.

Although the present invention has been described with reference to specific embodiments, those of skill in the art will recognize that changes may be made thereto without departing from the spirit and scope of the present invention as set forth in the hereafter appended claims.

The invention claimed is:

1. A semiconductor light emitting device, comprising:
   a crystal growth layer; and
   a crystal layer formed of a first conductive type layer, an active layer, and a second conductive type layer, the crystal layer being provided on an upper side of the crystal growth layer;
   wherein a back plane of the crystal growth layer has a light scattering region that includes irregularities that include a plurality of depressions and the irregularities are formed by irradiating the back plane of the crystal growth layer with an energy beam.

2. A semiconductor light emitting device as claimed in claim 1, wherein the crystal growth layer is formed on a substrate.

3. A semiconductor light emitting device as claimed in claim 1, wherein the crystal growth layer has a wurtzite type crystal structure.

4. A semiconductor light emitting device as claimed in claim 1, wherein the crystal growth layer is made from a nitride semiconductor.

5. A semiconductor light emitting device as claimed in claim 1, wherein the active layer is made from InGaN.

6. A semiconductor light emitting device as claimed in claim 1, wherein the crystal layer having a light scattering region is on a n-side of the active layer.

7. A semiconductor light emitting device as claimed in claim 2, wherein a principal plane of the substrate has irregularities.

8. A semiconductor light emitting device as claimed in claim 2, wherein the principal plane of the substrate is one of a C-plane and a plane substantially equal to the C-plane.

9. A semiconductor light emitting device as claimed in claim 7, wherein the crystal growth layer has crystal planes tilted from the principal plane of the substrate.

10. A semiconductor light emitting device as claimed in claim 9, wherein the tilted crystal planes are six planes substantially symmetric to each other.

11. A semiconductor light emitting device as claimed in claim 9, wherein the tilted crystal planes include at least one of an S-plane and a (11–22) plane.

12. A semiconductor light emitting device as claimed in claim 9, wherein the crystal growth layer is provided on the substrate by selective growth via an under growth layer.

13. A semiconductor light emitting device as claimed in claim 12, wherein the selective growth is performed by making use of selective removal of the under growth layer.

14. A semiconductor light emitting device as claimed in claim 12, wherein the selective growth is performed by making use of an opening portion selectively formed in a mask layer.

15. A semiconductor light emitting device as claimed in claim 9, wherein a current is injected only to the tilted crystal planes.

16. A semiconductor light emitting device as claimed in claim 9, wherein the crystal growth layer has a flat plane composed of a C-plane at an approximately center portion of an upper portion of the crystal growth layer.

17. A semiconductor light emitting device as claimed in claim 14, wherein the crystal growth layer is formed by selective growth from the opening portion of the mask layer in a lateral direction.

18. An image display unit, comprising:

an array of semiconductor light emitting devices, each of which emits light in response to a signal;

wherein each of the semiconductor light emitting devices includes a crystal growth layer and a crystal layer formed of a first conductive type layer, an active layer and a second conductive type layer, the crystal layer being provided on an upper side of the crystal growth layer, wherein a back plane of the crystal growth layer has a light scattering region that includes irregularities that include a plurality of depressions and the irregularities are formed by irradiating the back plane of the crystal growth layer with an energy beam.

19. A lighting apparatus, comprising:

an array of semiconductor light emitting devices, each of which emits light in response to a signal;

wherein each of the semiconductor light emitting devices includes a crystal growth layer and a crystal layer formed of a first conductive type layer, an active layer and a second conductive type layer, the crystal layer being provided on an upper side of the crystal growth layer, wherein a back plane of the crystal growth layer has a light scattering region that includes irregularities that include a plurality of depressions and the irregularities are formed by irradiating the back plane of the crystal growth layer with an energy beam.

* * * * *